United States Patent
Zhan et al.

(10) Patent No.: US 9,129,806 B2
(45) Date of Patent: Sep. 8, 2015

(54) PROTECTION DEVICE AND RELATED FABRICATION METHODS

(71) Applicants: Rouying Zhan, Gilbert, AZ (US); Chai Ean Gill, Chandler, AZ (US); Wen-Yi Chen, Chandler, AZ (US); Michael H. Kaneshiro, Chandler, AZ (US)

(72) Inventors: Rouying Zhan, Gilbert, AZ (US); Chai Ean Gill, Chandler, AZ (US); Wen-Yi Chen, Chandler, AZ (US); Michael H. Kaneshiro, Chandler, AZ (US)

(73) Assignee: FREESCALE SEMICONDUCTOR INC., Austin, TX (US)

( * ) Notice: Subject to any disclaimer, the term of this patent is extended or adjusted under 35 U.S.C. 154(b) by 0 days.

(21) Appl. No.: 13/900,256

(22) Filed: May 22, 2013

(65) Prior Publication Data

US 2014/0346560 A1 Nov. 27, 2014

(51) Int. Cl.
*H01L 29/74* (2006.01)
*H01L 29/66* (2006.01)
*H01L 27/02* (2006.01)

(52) U.S. Cl.
CPC .................. *H01L 27/0259* (2013.01)

(58) Field of Classification Search
CPC ..... H01L 29/74; H01L 29/66; H01L 29/7424; H01L 29/66386; H01L 27/0259
USPC .......................................... 257/110; 438/140
See application file for complete search history.

(56) References Cited

U.S. PATENT DOCUMENTS

| | | | |
|---|---|---|---|
| 6,747,294 B1 | 6/2004 | Gupta et al. | |
| 7,427,787 B2 | 9/2008 | Steinhoff | |
| 7,566,914 B2 | 7/2009 | Salcedo et al. | |
| 7,701,012 B2 | 4/2010 | Xu et al. | |
| 2007/0018250 A1 | 1/2007 | Cai et al. | |
| 2009/0115018 A1 | 5/2009 | Mallikarjunaswamy | |
| 2009/0213506 A1 | 8/2009 | Zhan et al. | |
| 2010/0230719 A1 | 9/2010 | Sawahata | |
| 2010/0244088 A1 | 9/2010 | Whitfield et al. | |
| 2011/0172643 A1 | 7/2011 | Jansen et al. | |
| 2011/0175198 A1 | 7/2011 | Zhan et al. | |
| 2011/0176244 A1 | 7/2011 | Gendron et al. | |
| 2011/0204415 A1 | 8/2011 | Van Wijmeersch et al. | |
| 2014/0346560 A1 | 11/2014 | Zhan et al. | |

OTHER PUBLICATIONS

Zhan, R., et al., U.S. Appl. No. 13/599,244, filed Aug. 30, 2012.
Zhan, R., et al., U.S. Appl. No. 13/900,226, filed May 22, 2013.
USPTO, Office Action for U.S. Appl. No. 13/900,226, mailed Jan. 12, 2015.
USPTO, Reply to Restriction Requirement for U.S. Appl. No. 13/900,226, mailed Nov. 26, 2014.
USPTO, Final Office Action in U.S. Appl. No. 13/900,226, mailed Jun. 25, 2015.

*Primary Examiner* — Asok K Sarkar
*Assistant Examiner* — Dmitriy Yemelyanov
(74) *Attorney, Agent, or Firm* — Ingrassia Fisher & Lorenz, P.C.

(57) ABSTRACT

Protection device structures and related fabrication methods are provided. An exemplary semiconductor protection device includes a base well region having a first conductivity type, an emitter region within the base well region having a second conductivity type opposite the first conductivity type, a collector region having the second conductivity type, a first floating region having the second conductivity type within the base well region between the emitter region and the collector region, and a second floating region having the first conductivity type within the base well region between the first floating region and the collector region. The floating regions within the base well region are electrically connected to reduce current gain and improve holding voltage.

17 Claims, 14 Drawing Sheets

PROTECTION DEVICE AND RELATED FABRICATION METHODS

CROSS-REFERENCE TO RELATED APPLICATIONS

The subject matter described herein is related to the subject matter described in U.S. patent application Ser. No. 13/900,226, filed concurrently herewith.

TECHNICAL FIELD

Embodiments of the subject matter described herein relate generally to electronic devices, and more particularly, to electrostatic discharge protection devices and related fabrication methods.

BACKGROUND

Modern electronic devices, and particularly, integrated circuits, are at risk of damage due to electrostatic discharge (ESD) events. During an ESD event, a voltage (or current) may be provided to one or more terminals of an electronic device that causes the voltage between those terminals to exceed the design voltage of the device, which could impair subsequent operation of the device. For example, a voltage at a terminal of an electronic device during an ESD event may exceed the breakdown voltage of one or more components of the device, and thereby potentially damage those components. Accordingly, electronic devices include discharge protection circuitry that provides protection from excessive voltages across electrical components during ESD events.

To avoid interfering with normal operation of the device being protected, the discharge protection circuitry is typically designed to turn on and conduct current when the applied voltage exceeds the operating voltage of the device but before the applied voltage exceeds the breakdown voltage of the device. In practice, the discharge protection circuitry may continue to conduct current after being triggered by a transient voltage until the applied voltage is decreased below a particular voltage, referred to as a holding (or snapback) voltage. Accordingly, when the holding voltage is less than the design voltage, discharge protection circuitry may be susceptible to latchup and continue to conduct current at the design voltage, thereby impairing the functionality of the discharge protection circuitry after an ESD event.

BRIEF DESCRIPTION OF THE DRAWINGS

The various embodiments will hereinafter be described in conjunction with the following drawing figures, which are not necessarily drawn to scale, wherein like numerals denote like elements, and wherein.

DETAILED DESCRIPTION

The following detailed description is merely illustrative in nature and is not intended to limit the embodiments of the subject matter or the application and uses of such embodiments. Any implementation described herein as exemplary is not necessarily to be construed as preferred or advantageous over other implementations. Additionally, there is no intention to be bound by any expressed or implied theory presented in the preceding technical field, background, or the following

DETAILED DESCRIPTION

Embodiments of the subject matter described herein relate to electrostatic discharge (ESD) protection devices and related circuitry that are less susceptible to latchup by increasing the holding (or snapback) voltage of an ESD clamping circuit. As described in greater detail below, the ESD clamping circuit includes a bipolar junction transistor (BJT) having electrically connected floating doped regions formed within the well region associated with its base electrode, which, in turn, reduce the current gain ($\beta$) for the BJT and thereby increase the holding voltage of the ESD clamping circuit after avalanche breakdown. The doped regions are floating in that they cooperatively provide a current path that reduces current gain but are not directly connected to any device terminals or any other external circuitry that could ground or otherwise influence the electrical potential of the doped regions.

Figure 1:
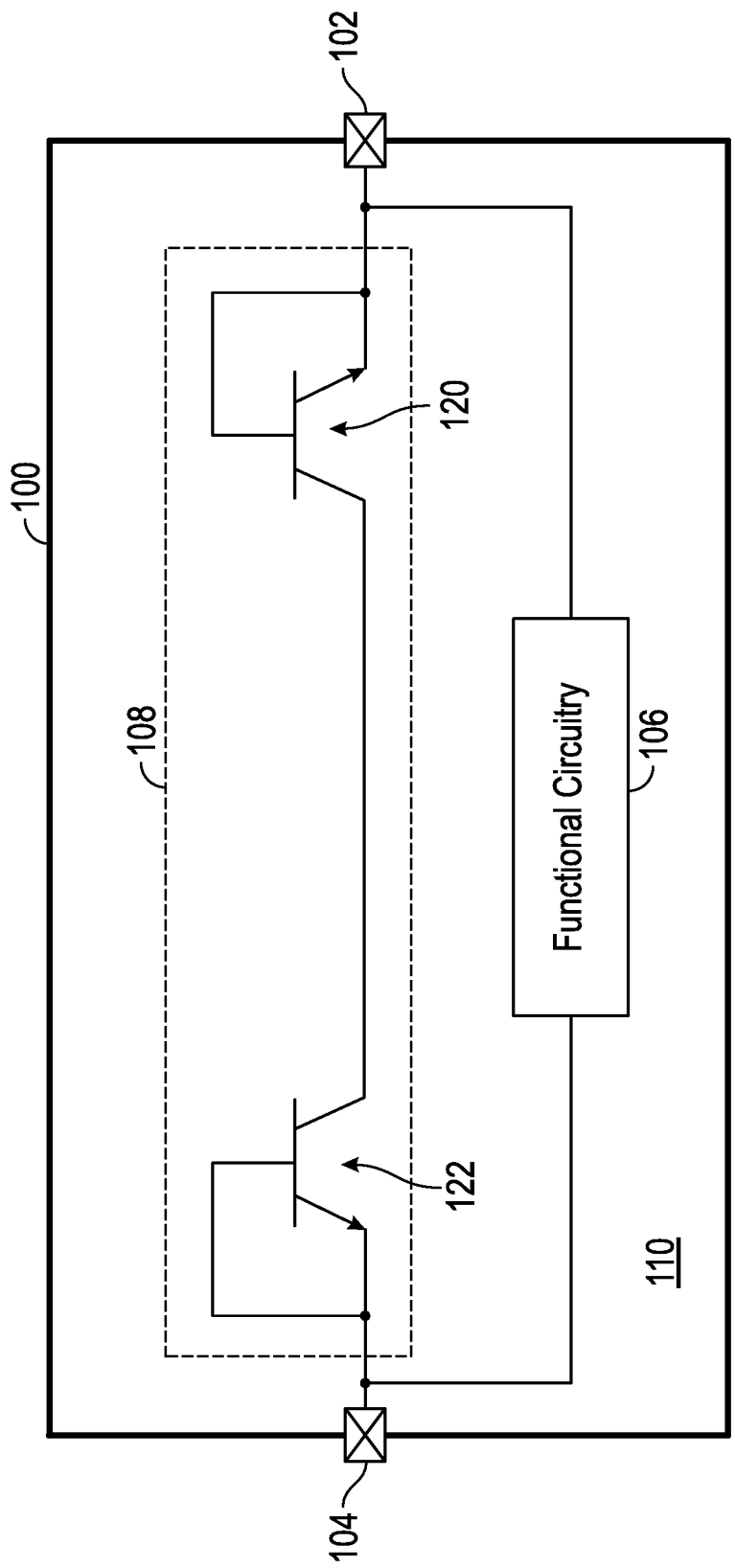
FIG. 1 is a schematic diagram of an exemplary electronic device in accordance with one embodiment of the invention.

Turning now to FIG. 1, an exemplary electronic device package 100 includes one or more package interfaces 102, 104, functional circuitry 106 coupled to the package interfaces 102, 104, and protection circuitry 108 coupled to the interfaces 102, 104. In exemplary embodiments, the functional circuitry 106 and the protection circuitry 108 are formed, fabricated, mounted, or otherwise provided on a substrate 110 and encapsulated in a common device package to obtain the electronic device 100. In this regard, in some embodiments, the substrate 110 may be realized as a common semiconductor substrate having both the functional circuitry 106 and the protection circuitry 108 fabricated thereon, while in other embodiments, the substrate 110 may be realized as a package substrate (e.g., a lead frame, circuit board, or the like) that the functional circuitry 106 and the protection circuitry 108 are soldered, affixed, or otherwise mounted to. It should be understood that FIG. 1 is a simplified representation of the electronic device 100 for purposes of explanation and ease of description, and FIG. 1 is not intended to limit the application or scope of the subject matter in any way. Thus, although FIG. 1 depicts direct electrical connections between components, alternative embodiments may employ intervening circuit elements and/or components while functioning in a substantially similar manner.

The package interfaces 102, 104 generally represent the physical input/output interfaces to/from the functional circuitry 106 encapsulated in the electronic device 100. Depending on the embodiment, each of the package interfaces 102, 104 may be realized as an individual pin, pad, lead, terminal, solder ball, or another suitable physical interface to the electronic device 100. In accordance with one or more embodiments, the design (or intended) voltage for the first package interface 102 is greater than the design voltage for the second package interface 104. For example, the first package interface 102 may be realized as a positive reference (or supply) voltage input to the electronic device 100 and the second package interface 104 is realized as a negative reference (or ground) voltage input to the electronic device 100. Accordingly, for purposes of explanation, but without limitation, the first package interface 102 may alternatively be referred to herein as the higher voltage terminal, the positive reference voltage terminal, the supply voltage terminal, or the like, while the second package interface 104 may alternatively be referred to herein as the lower voltage terminal, the negative reference voltage terminal, the ground voltage terminal, or the like.

The functional circuitry 106 generally represents the components of the electronic device 100 configured to provide the desired functionality for the electronic device 100. In this regard, depending on the embodiment, the functional circuitry 106 may be realized as any suitable combination of processing circuitry (e.g., one or more processing cores, processors, controllers, microcontrollers, microprocessors, or the like), logic circuitry, memories or other data storage elements, discrete components, analog and/or digital components, or other hardware components and/or circuitry configured to provide the desired functionality for the electronic device 100. In an exemplary embodiment, the functional circuitry 106 is coupled to the package interfaces 102, 104 to receive a supply voltage, design voltage, or another operating voltage that facilitates the desired operation of the functional circuitry 106.

Still referring to FIG. 1, the protection circuitry 108 is connected electrically between the higher voltage terminal 102 and the lower voltage terminal 104 and configured electrically parallel to the functional circuitry 106 to protect the functional circuitry 106 from a transient voltage difference between the device terminals 102, 104 that exceeds a breakdown voltage ($V_B$) of the functional circuitry 106. In the illustrated embodiment, the protection circuitry 108 functions as an ESD voltage clamp that begins conducting current when the transient voltage difference between the device terminals 102, 104 exceeds a transient triggering voltage ($V_{T1}$) of the protection circuitry 108. In this regard, both the steady state (or DC) breakdown voltage ($V_{TDC}$) and transient triggering voltage ($V_{T1}$) of the protection circuitry 108 are chosen to be greater than the supply (or operating) voltage ($V_O$) of the functional circuitry 106 but less than the breakdown voltage ($V_B$) of the functional circuitry 106. In this manner, the protection circuitry 108 conducts current when the voltage difference between the terminals 102, 104 exceeds a ESD triggering voltage (i.e., the DC breakdown voltage ($V_{TDC}$) or the transient triggering voltage ($V_{T1}$)) and thereby clamps the voltage difference that the functional circuitry 106 is exposed to. Thus, the likelihood of the functional circuitry 106 being exposed to a voltage difference that exceeds the breakdown voltage ($V_B$) of the functional circuitry 106 during an ESD event is reduced.

In exemplary embodiments, the protection circuitry 108 includes a pair of bipolar junction transistor (BJT) elements 120, 122 configured to provide an ESD voltage clamp. As illustrated, a first NPN bipolar transistor element 120 has an emitter electrode coupled to the higher voltage terminal 102, a base electrode electrically connected directly to the emitter electrode (e.g., short-circuited or via a negligible series impedance) and coupled to the higher voltage terminal 102, and a collector electrode coupled to the collector electrode of the second NPN bipolar transistor element 122. As described in greater detail below, in exemplary embodiments, the collector electrodes of the bipolar transistor elements 120, 122 are realized using a common doped region, that is, the bipolar transistor elements 120, 122 share a common collector electrode region formed in a semiconductor substrate. The emitter electrode of the second bipolar transistor element 122 is coupled to the lower voltage terminal 104 and the base electrode of the second bipolar transistor element 122 is electrically connected (or short-circuited) to the emitter electrode and coupled to the lower voltage terminal 104. The common collector electrodes of the bipolar transistor elements 120, 122 provide a parasitic bipolar junction transistor element configured between the base regions of the bipolar transistor elements 120, 122.

The protection circuitry 108 is bidirectional and capable of conducting current in either direction between terminals 102, 104 to clamp voltages between terminals 102, 104 from ESD events with either polarity. In other words, the protection circuitry 108 conducts current from the higher voltage terminal 102 to the lower voltage terminal 104 when the voltage at the higher voltage terminal 102 exceeds the voltage at the lower voltage terminal 104 by more than a first triggering voltage and conducts current from the lower voltage terminal 104 to the higher voltage terminal 102 when the voltage at the lower voltage terminal 104 exceeds the voltage at the higher voltage terminal 102 by more than a second triggering voltage. For purposes of explanation, the triggering voltage differential for conducting current from the higher voltage terminal 102 to the lower voltage terminal 104 may alternatively be referred to herein as the forward triggering voltage and the triggering voltage differential for conducting current from the lower voltage terminal 104 to the higher voltage terminal 102 may alternatively be referred to herein as the reverse triggering voltage.

Figure 2:
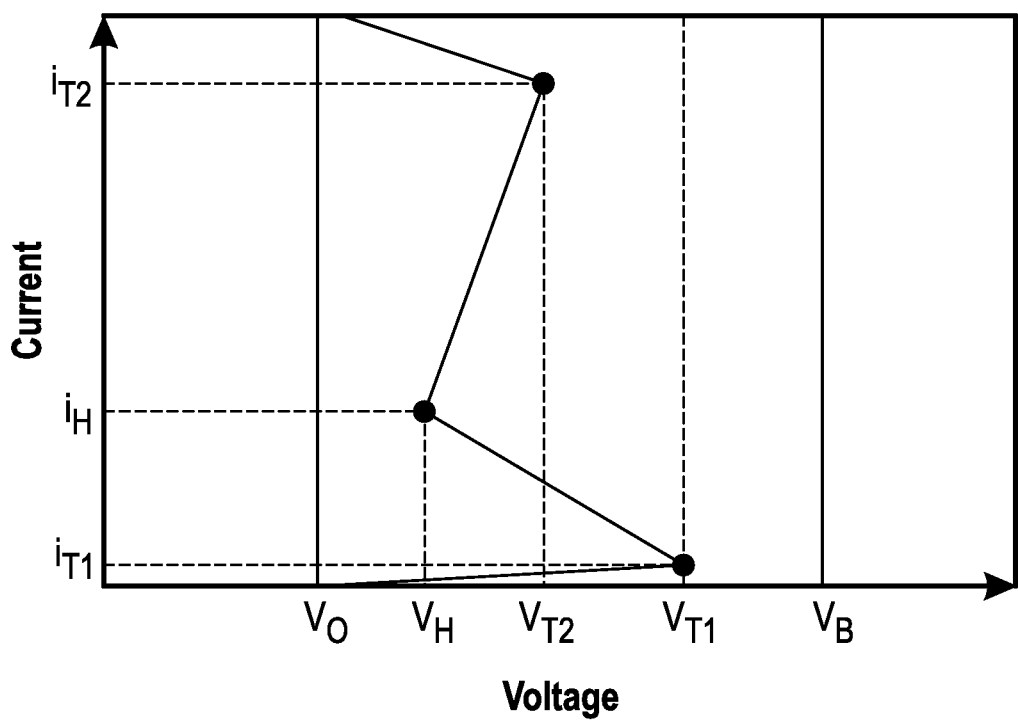
FIG. 2 is a graph depicting the relationship between transmission line pulse current and voltage for the protection circuitry in the electronic device of FIG. 1 in accordance with one embodiment.

FIG. 2 illustrates a graph of a transmission line pulse current versus voltage for a typical ESD protection circuit, such as, for example, the protection circuitry 108 of FIG. 1. Referring to FIGS. 1-2, as voltage applied to the device terminals 102, 104 is increased, very little current flows through the protection circuitry 108 until the transient triggering voltage ($V_{T1}$) of the protection circuitry 108 is reached, at which point avalanche breakdown in the BJT 122 occurs and the protection circuitry 108 begins conducting an ESD discharge current. The current through the protection circuitry 108 increases from a triggering current ($i_{T1}$) at the transient triggering point to a holding current ($i_H$) at a holding (or snapback) voltage ($V_H$), at which point the protection circuitry 108 will stop conducting current if the applied voltage between terminals 102, 104 falls below the holding voltage. Alternatively, if the applied ESD voltage (or current) increases, the discharge current through the protection circuitry 108 increases until reaching a thermal breakdown current ($i_{T2}$) at voltage ($V_{T2}$), at which point functionality of the protection circuitry 108 may be irreversibly impaired. This current ($i_{T2}$) may alternatively be referred to as the damage onset threshold current. It should be noted that, in practice, the DC breakdown voltage ($V_{TDC}$) of the protection circuitry 108 is typically less than the transient triggering voltage ($V_{T1}$).

Figure 15:
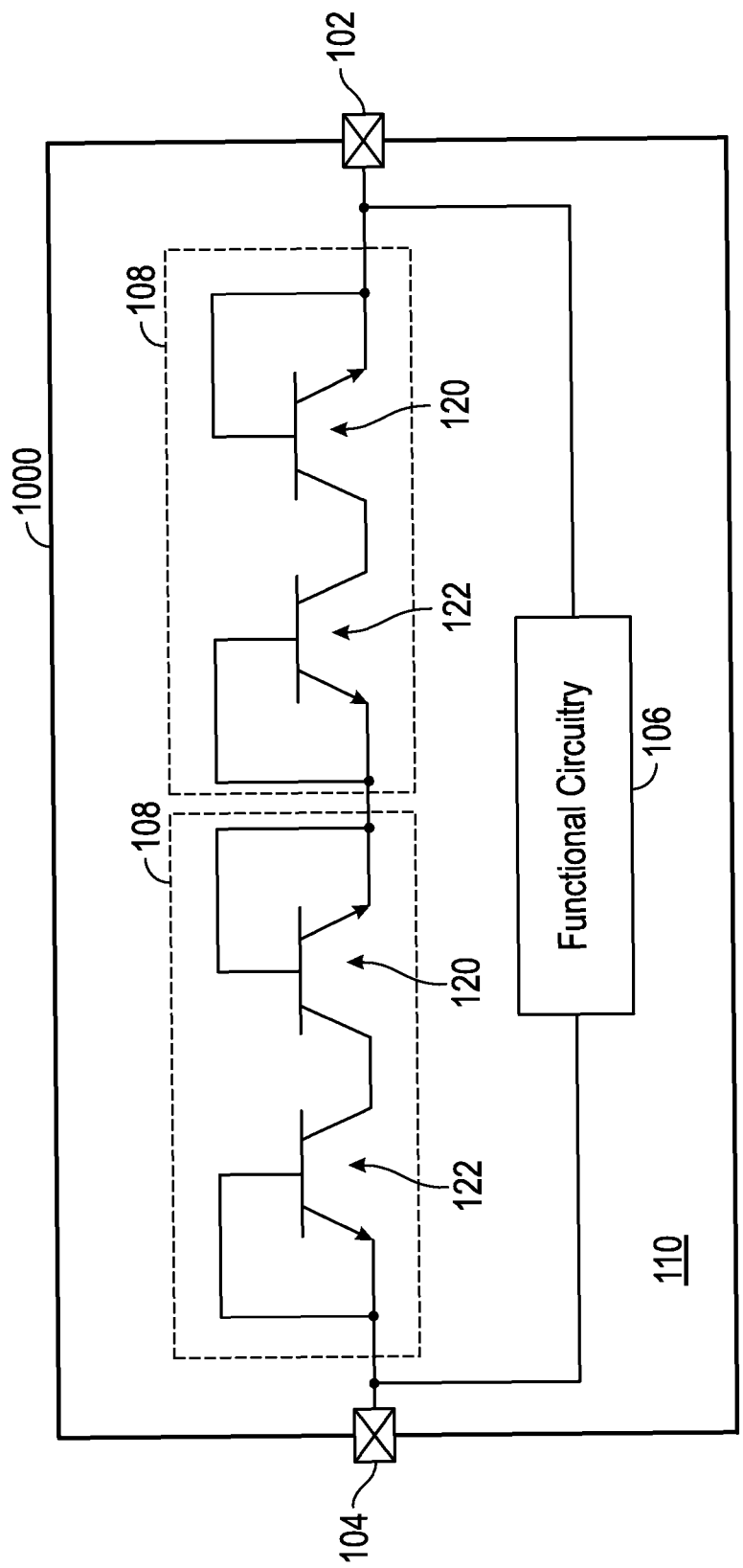
FIG. 15 is a schematic diagram of an electronic device having stacked protection circuitry in accordance with one embodiment of the invention.

Still referring to FIG. 1 and with reference to FIG. 15, in some embodiments, multiple instances of the protection circuitry 108 are stacked or cascoded electrically series between the device terminals 102, 104 to achieve greater triggering voltages. For example, the packaged electronic device 1000 depicted in FIG. 15 utilizes two instances of the protection circuitry 108 that are configured electrically in series otherwise cascoded between the device terminals 102, 104 (e.g., by providing an electrical connection from the emitter of BJT 122 of one instance of protection circuitry 108 to the emitter of BJT 120 of another instance of protection circuitry) to achieve a triggering voltage that is greater than the triggering voltage achievable by a singular instance of protection circuitry 108. In exemplary embodiments, the substrate 110 of the packaged electronic device 1000 including stacked protection circuitry 108 is realized as a SOI substrate that provides vertical isolation, which, in turn, allows the stacked instances of the protection circuitry 108 to be formed or otherwise provided on the substrate 110 adjacent to or otherwise proximate one another as illustrated in FIG. 15. In this regard, the vertical isolation provided by the SOI substrate combined with lateral isolation (e.g., deep trench isolation) between instances of the protection circuitry 108 prevents the substrate voltage underlying one instance of the protection circuitry 108 from influencing the breakdown of an adjacent instance of the protection circuitry 108. In alternative embodiments, instances of the protection circuitry 108 may be stacked when fabricated on a bulk substrate by providing an appropriate doping profile that isolates the protection circuitry 108 from the surrounding bulk substrate (e.g., by using N-type well regions and buried regions to provide isolation from a P-type bulk substrate).

FIGS. 3-12 illustrate, in cross-section, a protection device structure 300 suitable for use as the protection circuitry 108 in the electronic device 100 of FIG. 1 in accordance with one or more exemplary embodiments. Various steps in the manufacture of semiconductor devices are well known and so, in the interest of brevity, many conventional steps will only be mentioned briefly herein or will be omitted entirely without providing the well-known process details. Furthermore, it should be appreciated that although the subject matter may be described herein in the context of NPN bipolar junction transistor elements, the subject matter is not intended to be limited to NPN bipolar junction transistor elements and may be implemented in an equivalent manner for PNP bipolar junction transistor elements (e.g., by interchanging the conductivities of the doped regions).

Figure 12:
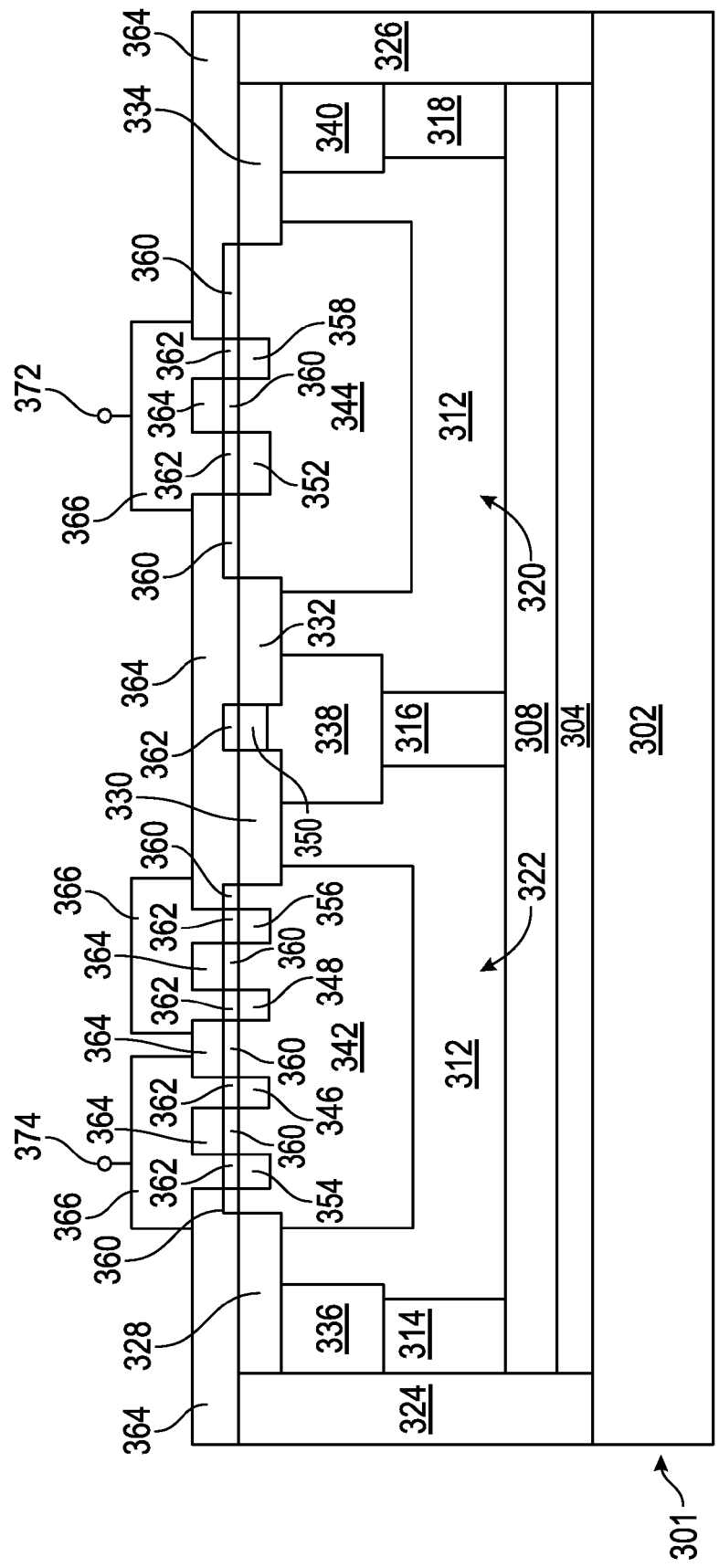

As best illustrated in FIG. 12, and with reference to FIG. 1, in exemplary embodiments, the protection circuitry 108 is realized as the protection device structure 300, which includes a pair of transistor regions 320, 322 having electrodes of the BJTs 120, 122 formed therein. In this regard, a first physical interface 372 is realized as the supply voltage terminal 102 and a second physical interface 374 is realized as the ground voltage terminal 104, wherein the first BJT 120 is comprised of N-type emitter region 352, P-type base regions 344, 358, and N-type collector regions 308, 316, 338 and second BJT 122 is comprised of N-type emitter region 346, P-type base regions 342, 354, and N-type collector regions 308, 316, 338. As described above, in exemplary embodiments, the protection device structure 300 is fabricated on a SOI substrate 301 that provides vertical isolation that allows multiple instances of the protection device structure 300 to be stacked or connected in series to achieve the desired triggering voltage and/or holding voltage required by the particular functional circuitry 106 of interest.

To achieve increased holding voltage, the base well region 342 of BJT 122 includes doped regions 348, 356 formed therein, with the doped regions 348, 356 being disposed laterally between the emitter region 346 and the collector well region 338 and at a floating electrical potential to reduce the current gain of the BJT 122. The floating regions 348, 356 have opposite conductivity with respect to one another and are short-circuited or otherwise electrically connected together without any intervening external circuit elements so that they have substantially the same electrical potential. For an NPN device, the P-type floating region 356 resides laterally between the floating N-type region 348 and the collector well region 338. The floating N-type region 348 resides laterally between the emitter region 346 and the collector well region 338 to collect a portion of electrons that would otherwise flow between the emitter region 346 and the collector well region 338 during an ESD event after the BJT 122 triggers or turns on by avalanche breakdown, while the P-type floating region 356 supplies holes that recombine with the electrons collected by N-type floating region 348 by virtue of the floating regions 348, 356 being electrically connected. In this manner, the floating regions 348, 356 are cooperatively configured to reduce the current gain of the BJT 122 after it turns on. By reducing the current gain, the holding voltage of the BJT 122 is increased, which, in turn, increases the holding voltage of the protection circuitry 108 and/or the protection device structure 300. It will be appreciated that a higher holding voltage reduces latch up susceptibility (e.g., by increasing the difference between the holding voltage and the supply (or operating) voltage and providing greater margin for manufacturing variations and the like).

Figure 3:
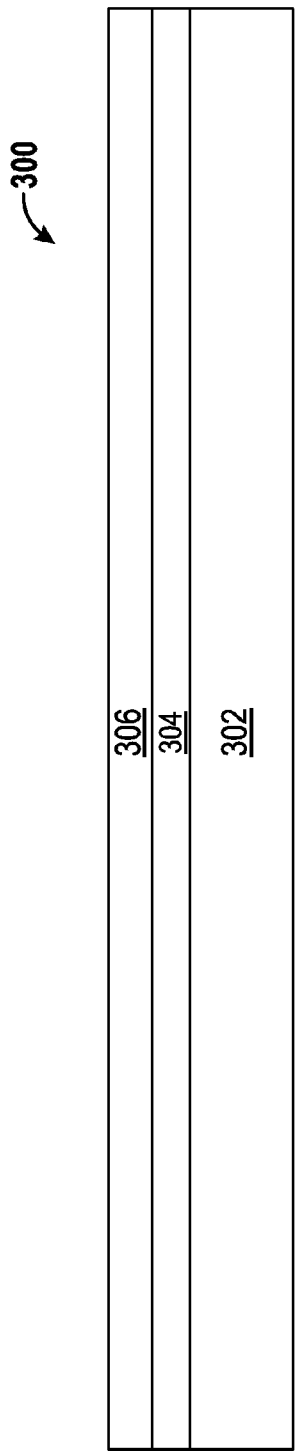
FIGS. 3-12 illustrate, in cross section, exemplary methods for fabricating a protection device structure suitable for use with the electronic device of FIG. 1 in accordance with one embodiment of the invention.

Referring now to FIG. 3, in exemplary embodiments, the protection device structure 300 is fabricated on a semiconductor substrate, such as a SOI substrate 301 having a support (or handle) layer 302 of semiconductor material, an insulating layer 304 of dielectric material on or otherwise overlying the support layer 302, and a layer 306 of semiconductor material on or otherwise overlying the insulating layer 304. As described in greater detail below, in exemplary embodiments, the layer 306 of semiconductor material is utilized to epitaxially grow additional semiconductor material thereon, and accordingly, for convenience, but without limitation, the layer 306 of semiconductor material may alternatively be referred to herein as the seed layer. In an exemplary embodiment, the semiconductor material of each of the layers 302, 306 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 302, 306 may be realized as germanium, gallium arsenide, and the like, and/or one or more of the layers 302, 306 may include layers of different semiconductor materials. In accordance with one embodiment, the insulating layer 304 is realized as an oxide layer formed in a subsurface region of the semiconductor substrate 301, also known as a buried oxide (BOX) layer. For example, the insulating layer 304 may be formed by oxidizing a wafer of semiconductor material (e.g., layer 306) which is then bonded to the support layer 302 to provide a buried layer of oxide material between the support layer 302 and the seed layer 306.

In exemplary embodiments, the seed layer 306 is lightly doped. For example, the seed layer 306 may be realized as a P-type silicon material having a P-type dopant concentration in the range of about $1 \times 10^{15}/cm^3$ to about $8 \times 10^{15}/cm^3$. The support layer 302 may also be doped with the same (or different) conductivity-determining impurity type as the seed layer 306. In exemplary embodiments, the support layer 302 is realized as an N-type silicon material. It should be understood that the protection devices and the fabrication processes described herein are not constrained by the substrate of semiconductor material utilized, and the fabrication process described herein may also be used to create protection devices on a bulk semiconductor substrate.

Figure 4:
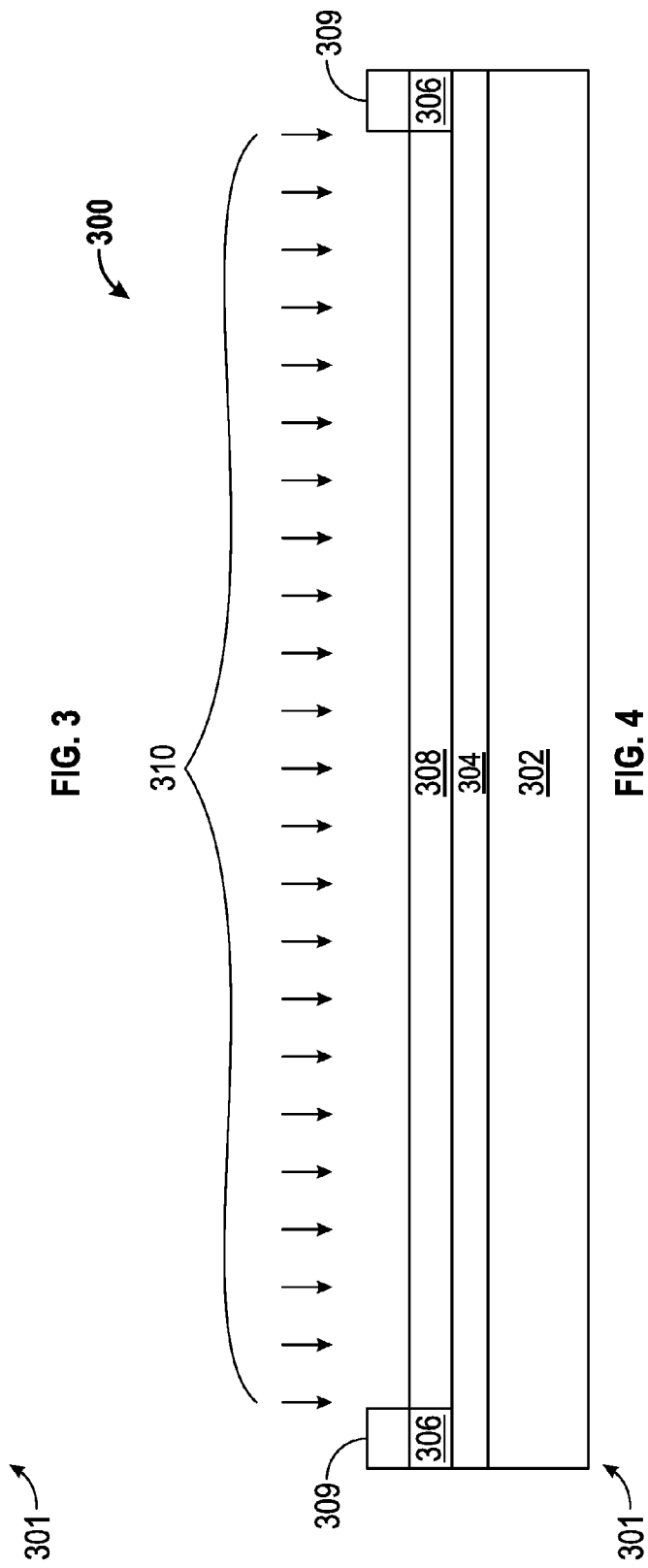

Referring to FIG. 4, in exemplary embodiments, fabrication of the protection device structure 300 continues by masking peripheral portions of the protection device structure 300 and forming a doped region 308 of semiconductor material within the seed layer 306 having a conductivity type that is opposite the conductivity of the seed layer 306. The doped region 308 is formed by masking the protection device structure 300 with a masking material 309, such as a photoresist material, that is patterned to provide an implantation mask that exposes the interior portion of the seed layer 306 to be used for the doped region 308. The doped region 308 is then formed by implanting N-type ions, such as antimony ions or phosphorous ions, illustrated by arrows 310, in the seed layer 306 with a dopant concentration in the range of about to about $1 \times 10^{18}/cm^3$ to about $1 \times 10^{19}/cm^3$ range of about 50 kiloelectron volts (keV) to about 2000 keV. In the illustrated embodiment, the depth of the doped region 308 (after subsequent thermal annealing or any other diffusion) corresponds to the thickness of the seed layer 306 so that the doped region 308 extends to and abuts or otherwise contacts the insulating layer 304. For example, in accordance with one or more embodiments, the thickness of the seed layer 306 is within the range of about 1 micrometer (or micron) to about 4 microns (depending on the needs of a particular application), and the doped region 308 has a depth in the range of 1 micron to about 4 microns that corresponds to the thickness of the seed layer 306.

Figure 5:
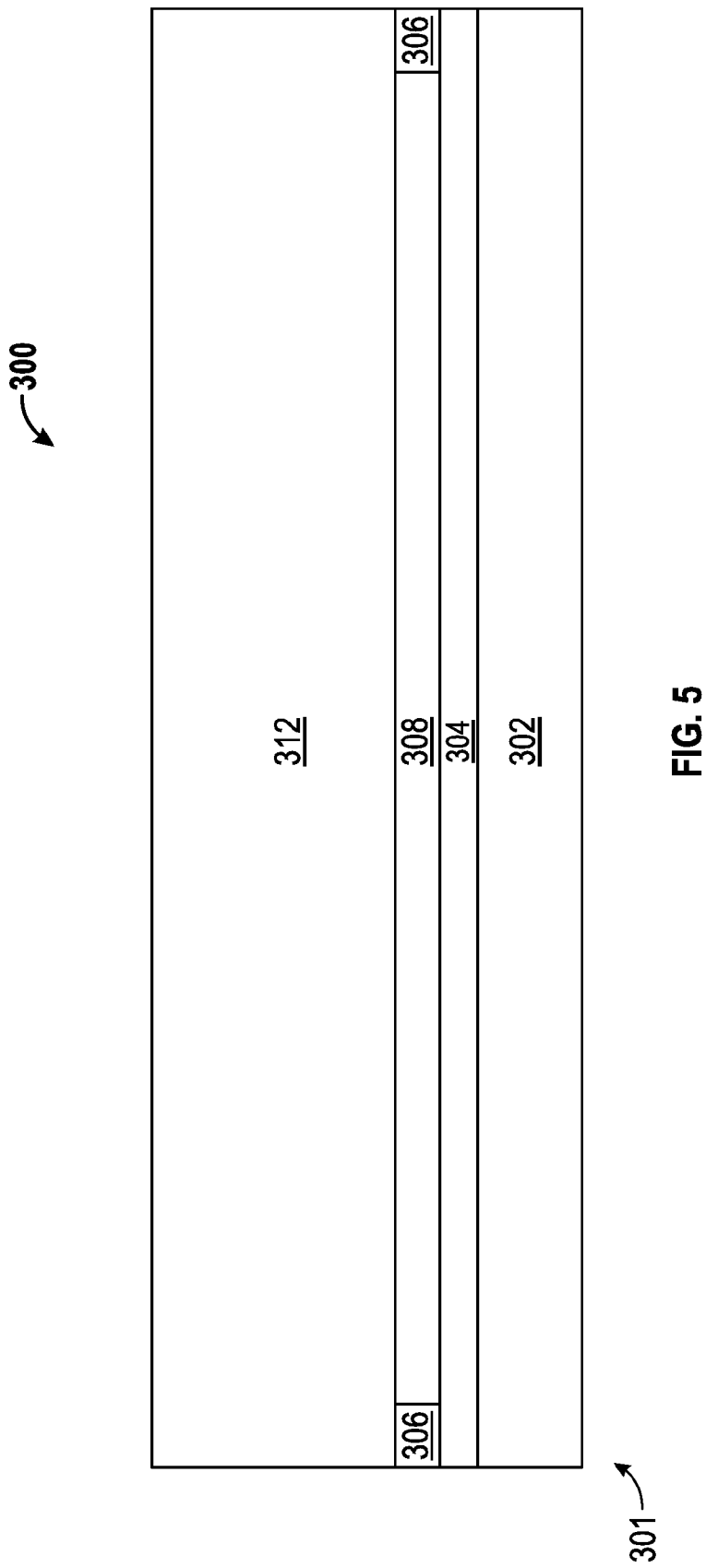

After forming the doped region 308, fabrication of the protection device structure 300 continues by removing the masking material 309 and forming or otherwise providing another doped region of semiconductor material that has a desired thickness overlying the doped region 308 and a conductivity type opposite the doped region 308, resulting in the protection device structure 300 illustrated in FIG. 5. For example, a P-type epitaxial layer 312 may be formed by epitaxially growing silicon material on the seed layer 306 and in-situ doping the silicon material by adding boron ions (or other P-type ions) to the reactants used to epitaxially grow the layer 312. In one or more embodiments, the epitaxial layer 312 has a P-type dopant concentration in the range of about $1 \times 10^{15}/cm^3$ to about $8 \times 10^{15}/cm^3$. In an exemplary embodiment, the epitaxial layer 312 is grown to a thickness in the range of about 2 microns to about 6 microns, which may vary depending on the needs of a particular application. It should be understood that the protection devices and the fabrication processes described herein are not constrained by the manner in which the doped region 308 and/or P-type layer 312 are formed, and the structure 300 illustrated in FIG. 5 may be fabricated or otherwise achieved in a variety of alternative manners (e.g., the P-type layer 312 does not necessarily need to be realized as an epitaxial layer and does not necessarily need to be epitaxially grown and/or in-situ doped, the doped region 308 does not necessarily need to be formed by ion implantation, etc.).

Figure 6:
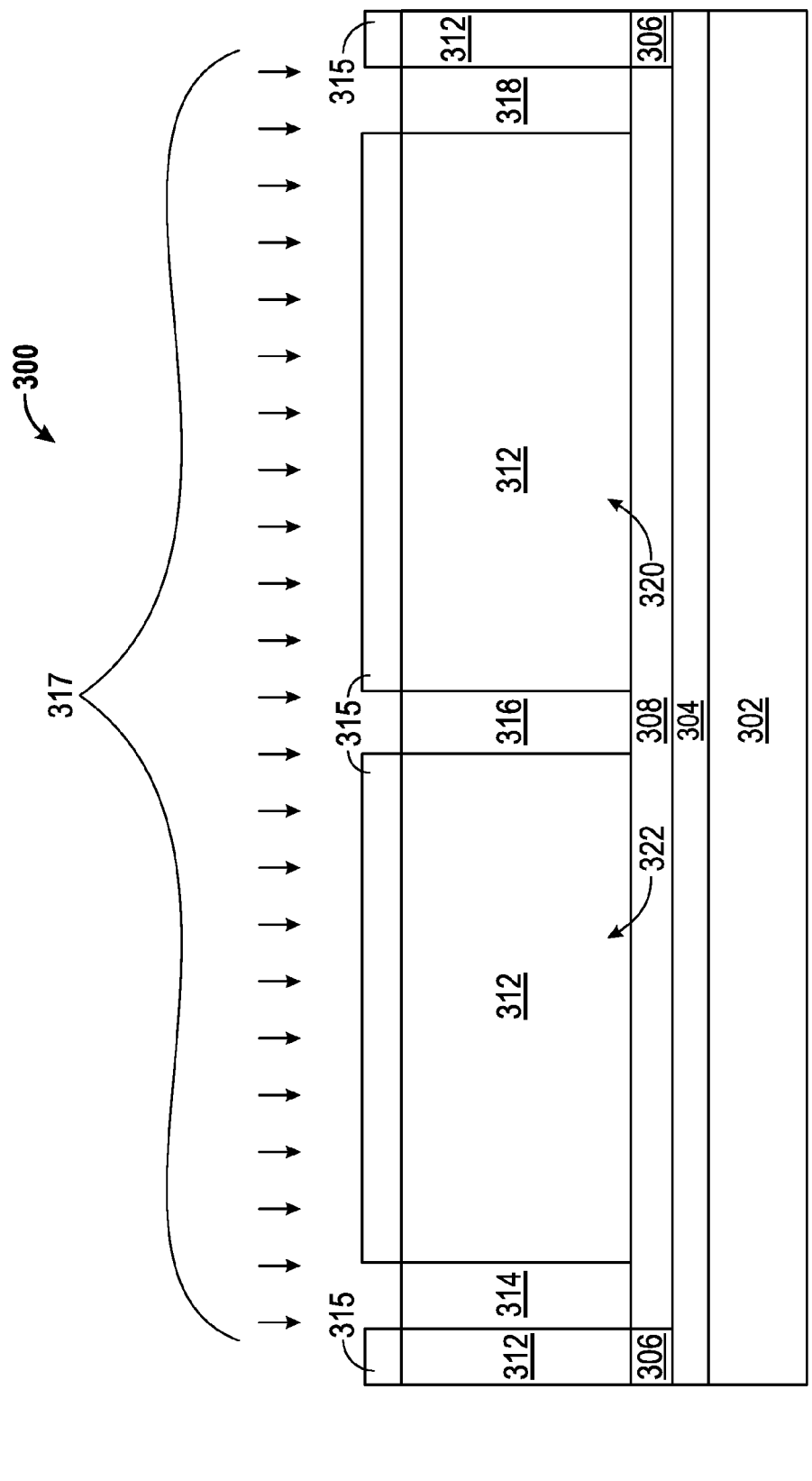

Turning now to FIG. 6, after forming the epitaxial layer 312, the fabrication process continues by masking portions of the epitaxial layer 312 and forming doped sinker regions 314, 316, 318 of semiconductor material having the opposite conductivity type within the epitaxial layer 312. The doped sinker regions 314, 316, 318 are formed by masking the protection device structure 300 with a masking material 315 that is patterned to provide an implantation mask that exposes an interior (or central) portion of the epitaxial layer 312 to be used for the interior doped sinker region 316 and peripheral portions of the epitaxial layer 312 to be used for peripheral doped sinker regions 314, 318 that abut subsequently formed deep trench isolation regions. For example, N-type sinker regions 314, 316, 318 are formed by implanting N-type ions, such as phosphorous ions or arsenic ions, illustrated by arrows 317, in the epitaxial layer 312 with a dopant concentration in the range of about $1 \times 10^{16}/cm^3$ to about $1 \times 10^{19}/cm^3$, and more preferably within the range of about $1 \times 10^{17}/cm^3$ to about $1 \times 10^{18}/cm^3$, at an energy level in the range of about 2000 keV to about 3000 keV to provide N-type sinker regions 314, 316, 318 with a depth (after subsequent thermal annealing or any other diffusion) corresponding to the thickness of the epitaxial layer 312 so that the N-type sinker regions 314, 316, 318 extend to and abut the N-type buried region 308, thereby electrically connecting the N-type sinker regions 314, 316, 318 to the N-type buried region 308. As illustrated, the N-type sinker regions 314, 316, 318 partition the P-type epitaxial layer 312 into separate P-type epitaxial regions 320, 322 having a respective bipolar junction transistor element of the protection circuitry 108 fabricated therein. For example, BJT 120 may be fabricated in a first P-type region 320 and BJT 122 may be fabricated in the second P-type region 322, as described in greater detail below.

Figure 7:
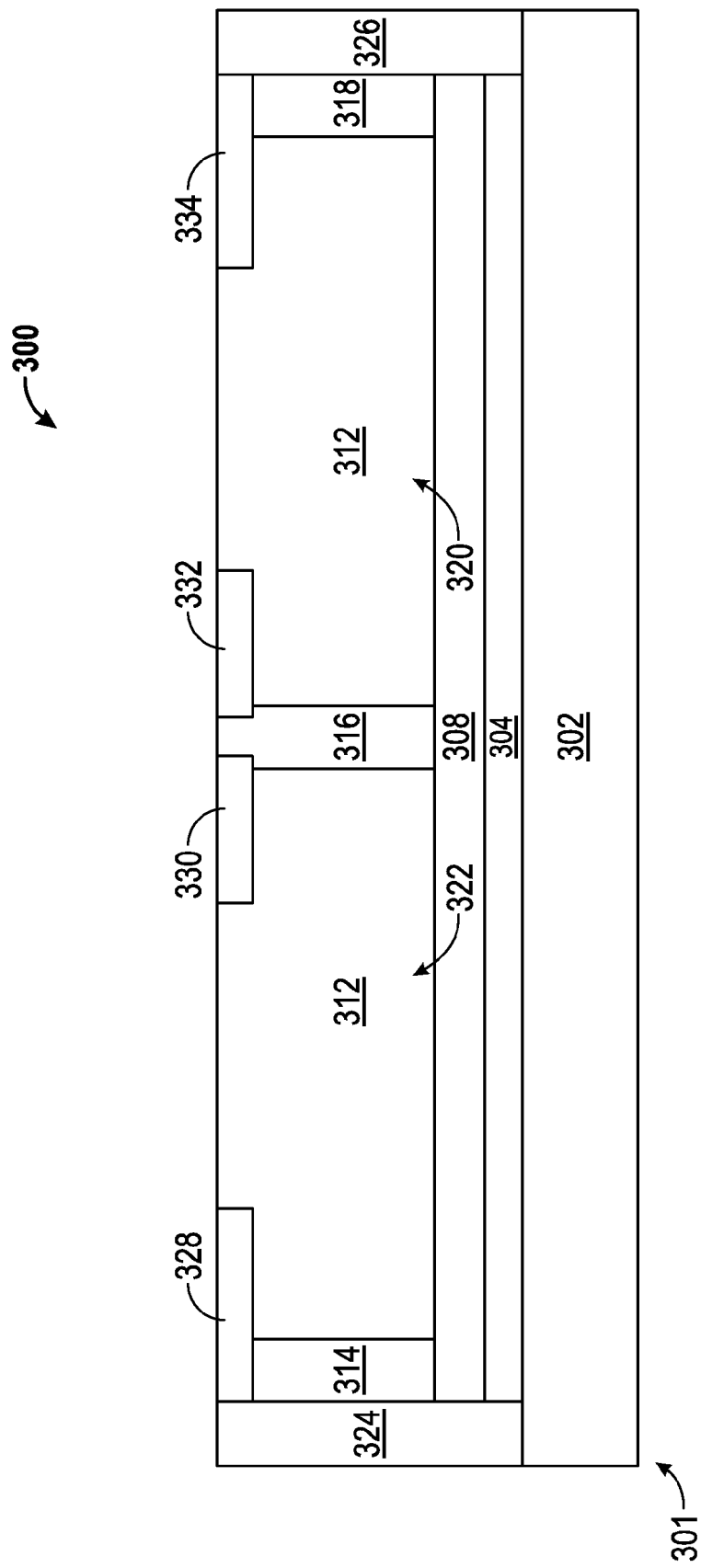

In the illustrated embodiment, after forming the N-type sinker regions 314, 316, 318, the fabrication process continues by forming isolation regions, resulting in the protection device structure 300 illustrated in FIG. 7. In an exemplary embodiment, the fabrication process isolates the protection circuitry from adjacent semiconductor devices by performing deep trench isolation (DTI) to provide deep isolation regions 324, 326 of dielectric material. For example, to form deep isolation regions 324, 326, the interior portion of the protection device structure 300 is masked with a masking material that is subsequently patterned to expose the peripheral portions of the epitaxial layer 312 and seed layer 306, which are then etched until the buried layer 304 is exposed, and thereafter, a dielectric material, such as an oxide material, may be deposited in the trenches or grown on exposed surfaces of the trenches to fill the trenches, resulting in deep isolation regions 324, 326.

Additionally, shallow isolation regions 328, 330, 332, 334 of a dielectric material are formed in the upper portions of the N-type sinker regions 314, 316, 318 and adjacent portions of P-type epitaxial regions 320, 322 by performing shallow trench isolation (STI). To form the shallow isolation regions 328, 330, 332, 334, portions of the epitaxial layer 312 are masked with a masking material that is patterned to expose the peripheral N-type sinker regions 314, 318, portions of the interior sinker region 316 adjacent to the epitaxial layer 312 (while leaving the central portion of the interior sinker region 316 masked), and portions of the P-type epitaxial regions 320, 322 adjacent to the N-type sinker regions 314, 316, 318 so that the shallow isolation regions 328, 330, 332, 334 are formed overlying portions of the epitaxial layer 312 adjacent to the N-type sinker regions 314, 316, 318. The exposed portions of the N-type sinker regions 314, 316, 318 and adjacent portions of the P-type epitaxial layer 312 are then etched to a desired depth (which is less than the thickness of the epitaxial layer 312), and a dielectric material, such as an oxide material, may be deposited to fill the trenches, resulting in shallow isolation regions 328, 330, 332, 334. In accordance with one or more exemplary embodiments, the depth of the shallow isolation regions 328, 330, 332, 334 is in the range of about 0.05 microns to about 1 micron, and more preferably, within the range of 0.2 microns to 0.5 microns. In the illustrated embodiment, the shallow isolation regions 328, 330, 332, 334 extend laterally beyond the boundaries of the N-type sinker regions 314, 316, 318.

Figure 8:
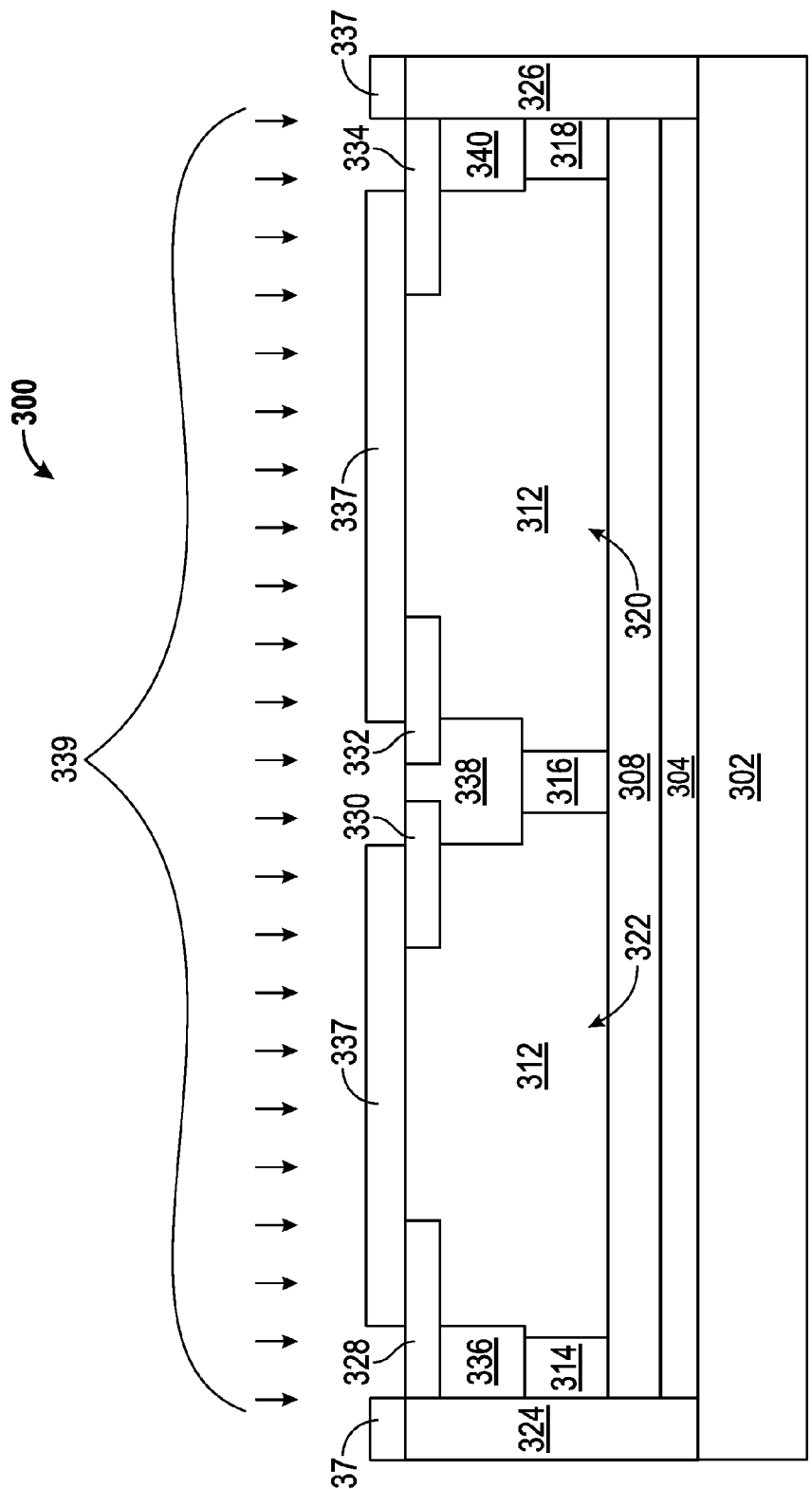

Turning now to FIG. 8, after forming the deep and shallow isolation regions, fabrication of the protection device structure 300 continues by masking interior portions of the P-type epitaxial regions 320, 322 and forming N-type well regions 336, 338, 340 either within the N-type sinker regions 314, 316, 318 or otherwise extending into and/or partially overlapping the N-type sinker regions 314, 316, 318. As illustrated, the N-well regions 336, 338, 340 are formed by masking the protection device structure 300 with a masking material 337 that is patterned to provide an implantation mask that exposes the sinker regions 314, 316, 318 while the remaining masking material 337 masks the deep trench isolation regions 324, 326 and interior portions of the P-type epitaxial regions 320, 322. The lateral edges of the implantation mask are offset from the boundaries of the P-type epitaxial regions 320, 322 with a respective sinker region 314, 316, 318 so that the subsequently formed N-well regions 336, 338, 340 extend laterally from a respective sinker region 314, 316, 318. In other words, the lateral width of a respective N-well region 336, 338, 340 is greater than the lateral width of the respective N-type sinker region 314, 316, 318 that respective N-well region 336, 338, 340 is formed in. The N-well regions 336, 338, 340 are then formed by implanting N-type ions, such as phosphorous ions or arsenic ions, illustrated by arrows 339, in the epitaxial layer 312 with a dopant concentration that is less than or equal to the dopant concentration of the N-type sinker regions 314, 316, 318, preferably within the range of about $1\times10^{16}/cm^3$ to about $1\times10^{19}/cm^3$, and at an energy level in the range of about 600 keV to about 2000 keV to provide the N-well regions 336, 338, 340 with a depth (after subsequent thermal annealing or any other diffusion) that is greater than a depth of the shallow isolation regions 328, 330, 332, 334 but less than a depth of the N-type sinker regions 314, 316, 318. In accordance with one or more exemplary embodiments, the depth of the N-well regions 336, 338, 340 is greater than 0.3 microns.

Figure 9:
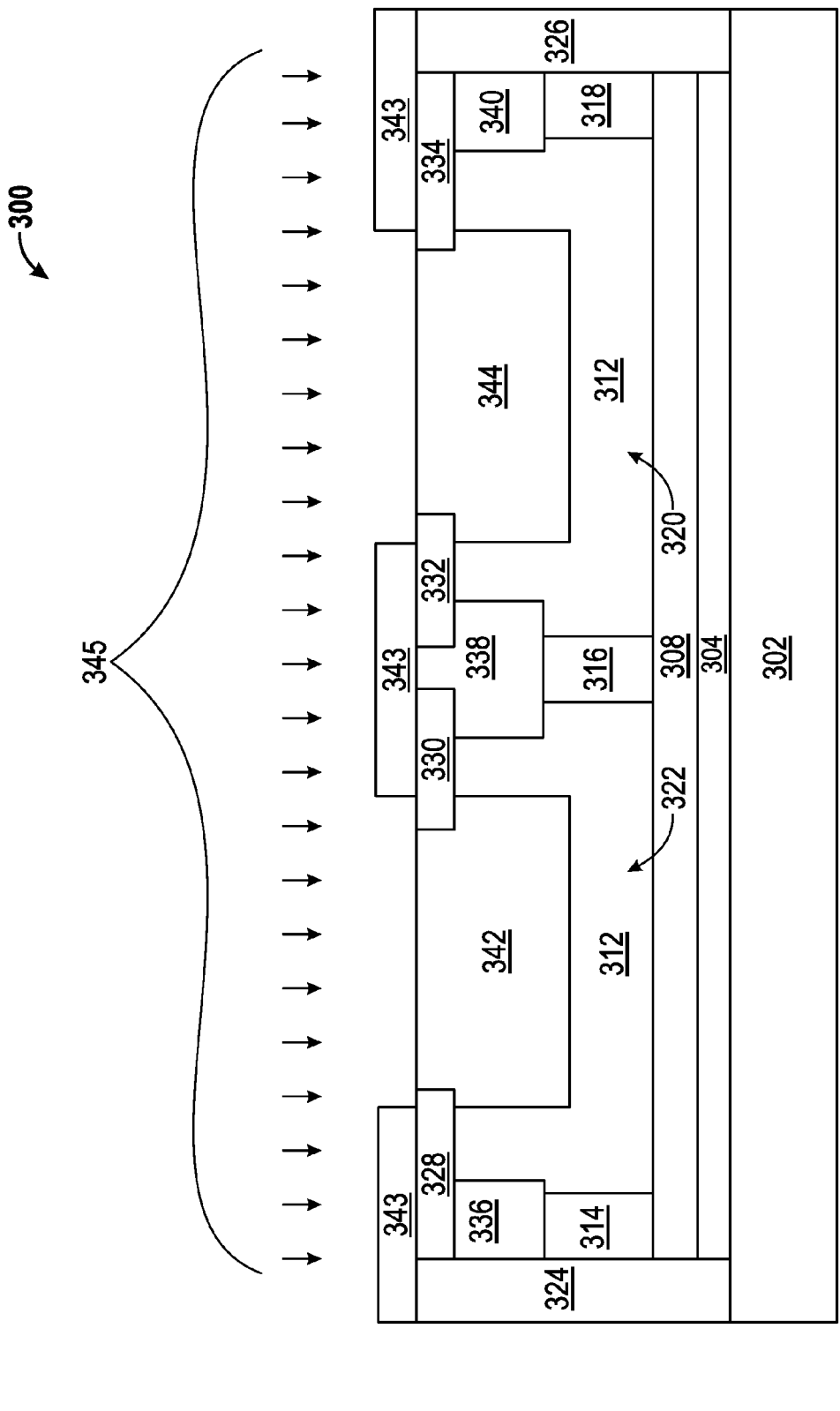

Turning now to FIG. 9, after forming the N-well regions 336, 338, 340, fabrication of the protection device structure 300 continues by masking the N-well regions 336, 338, 340 and forming P-type well regions 342, 344 in the interior portions of the P-type epitaxial regions 320, 322 between N-type sinker regions 314, 316, 318. As described above, the P-well regions 342, 344 function as a portion of the base regions of a respective bipolar junction transistor element (e.g., bipolar junction transistor elements 120, 122) that surrounds or otherwise encompasses the emitter electrode of that respective bipolar junction transistor element. The portion of the epitaxial layer 312 residing between the N-well region 338 and a respective P-well region 342, 344 dictates avalanche breakdown voltage across the collector-base junction (e.g., between N-well region 338 and a respective P-well region 342, 344). Avalanche breakdown between N-well region 338 and respective P-well region 342, 344 generates carriers, which, in turn, increase the electrical potential of the respective base well region 342, 344 to forward-bias the base-emitter junction and turn on a respective bipolar transistor element. In this regard, the lateral distance between a lateral boundary of a respective P-well region 342, 344 and the proximal lateral boundary of the collector well region 338 corresponds to the steady state (or DC) avalanche breakdown voltage for that respective bipolar transistor element. In the illustrated embodiments described herein, the P-well regions 342, 344 are spaced apart from the collector well region 338 by a lateral separation distance, wherein at least a portion of a respective lighter doped P-type epitaxial region 320, 322 remains intact laterally between the lateral boundary of a respective P-well region 342, 344 formed therein and the proximal lateral boundary of the collector well region 338. In one or more exemplary embodiments, the lateral separation distance between a lateral boundary of a respective P-well region 342, 344 and the proximal lateral boundary of the collector well region 338 is less than ten microns. In some embodiments, a respective P-well region 342, 344 may abut the collector well region 338.

To fabricate P-well regions 342, 344, the protection device structure 300 is masked with a masking material 343 that is patterned to provide an implantation mask that exposes interior portions of the P-type epitaxial regions 320, 322 while masking the N-well regions 336, 338, 340 and deep trench isolation regions 324, 326. In the illustrated embodiment of FIG. 9, the lateral edges of the implantation mask 343 are offset from lateral boundaries of the shallow isolation regions 328, 330, 332, 334 to expose portions of the shallow isolation regions 328, 330, 332, 334 so that the subsequently formed P-well regions 342, 344 extend laterally beneath adjacent isolation regions 328, 330, 332, 334. The P-well regions 342, 344 are then formed by implanting P-type ions, such as boron ions, illustrated by arrows 345, in the exposed portions of the epitaxial regions 320, 322 with a dopant concentration that is greater than the dopant concentration of the P-type epitaxial regions 320, 322, preferably within the range of $1\times10^{16}/cm^3$ to about $1\times10^{19}/cm^3$, and more preferably about $1\times10^{18}/cm^3$ to about $8\times10^{18}/cm^3$, and at an energy level in the range of about 100 keV to about 1500 keV to provide the P-well regions 342, 344 with a depth (after subsequent thermal annealing or any other diffusion) that is greater than a depth of the shallow isolation regions 328, 330, 332, 334 but less than the thickness of the epitaxial layer 312, so that at least a portion of the lighter doped P-type epitaxial layer 312 remains vertically between the P-well regions 342, 344 and the N-type buried region 308. In accordance with one or more exemplary embodiments, the depth of the P-well regions 342, 344 is greater than 0.3 microns.

Figure 10:
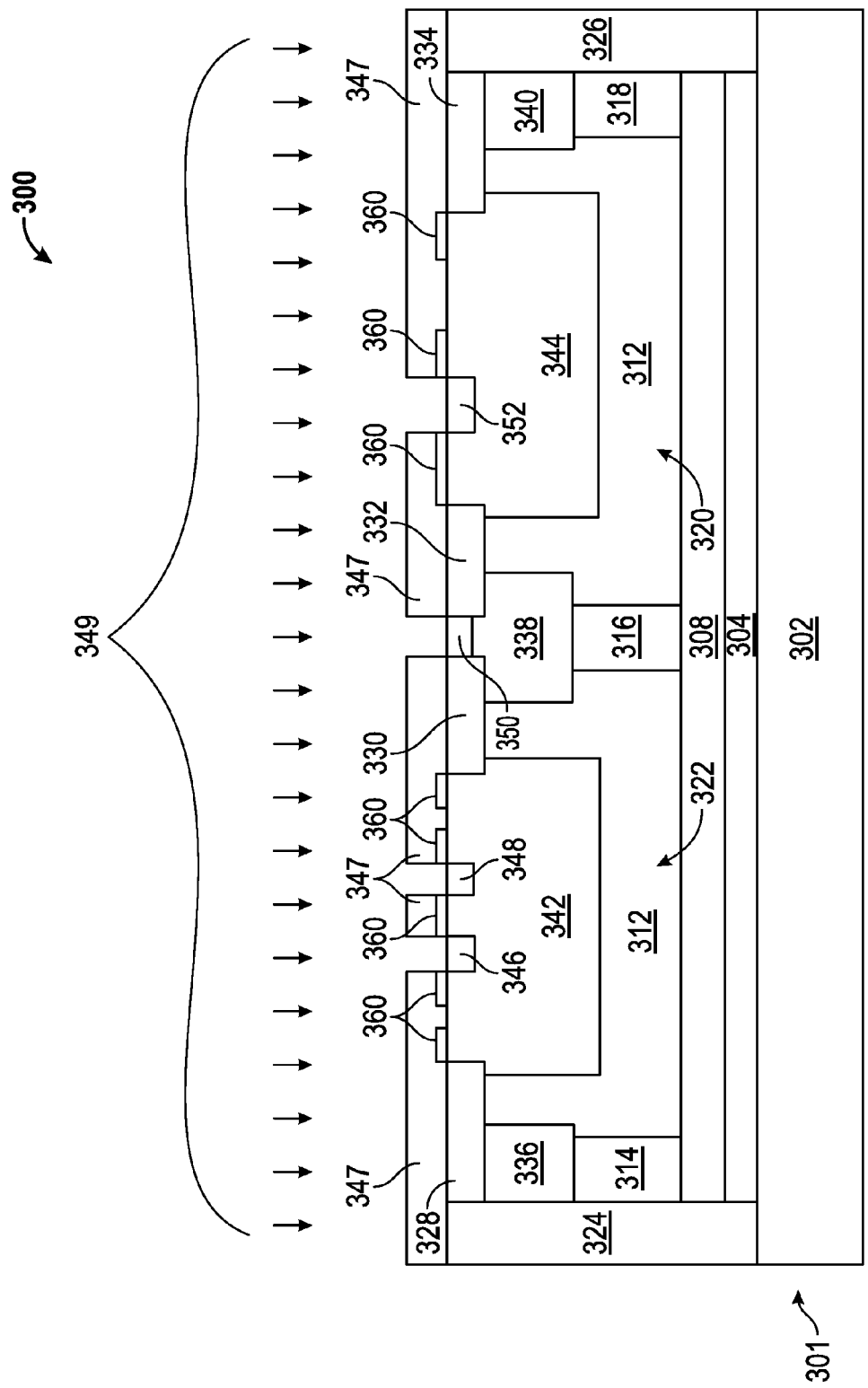
Figure 11:
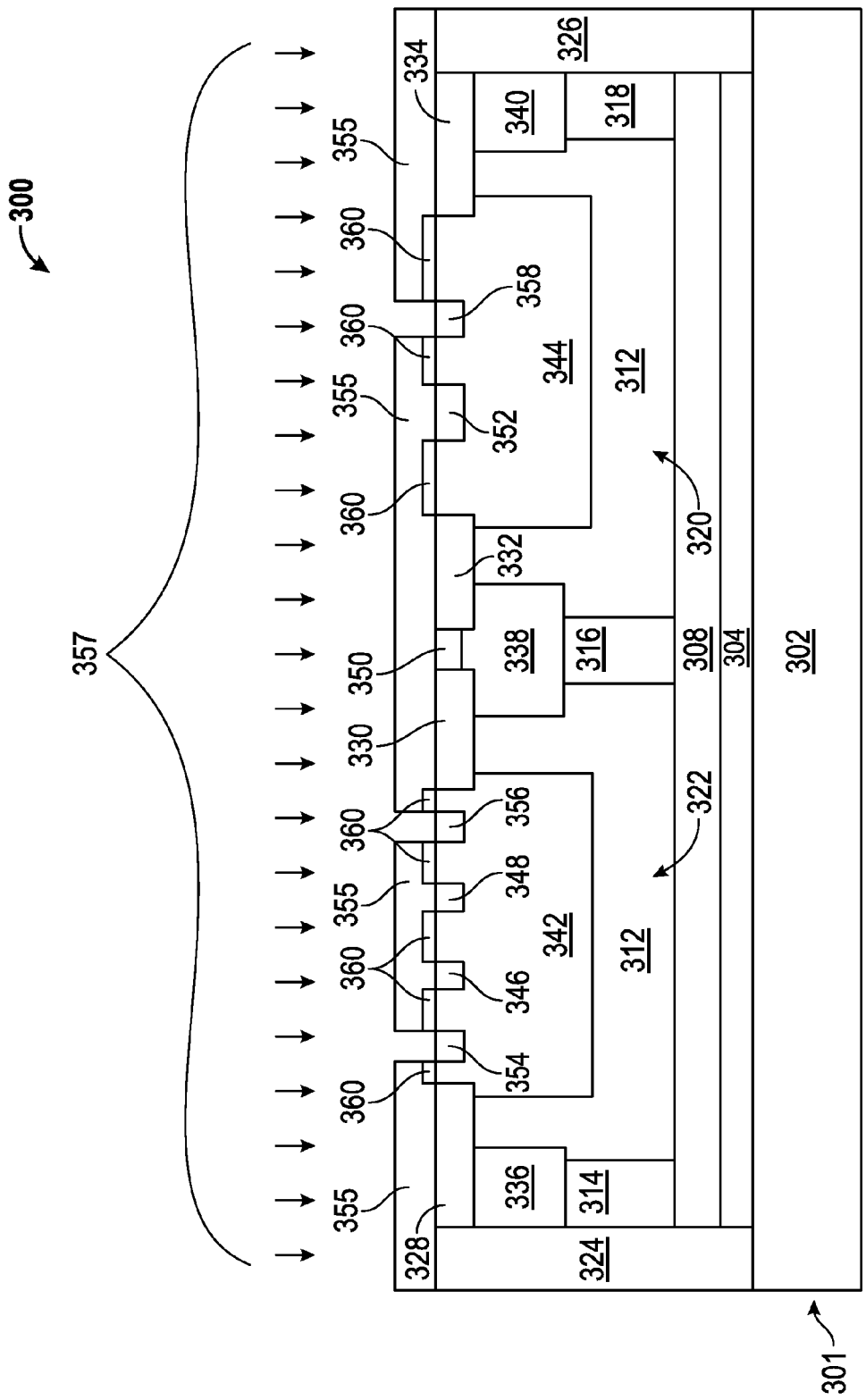

Referring now to FIGS. 10-11, after forming the P-well regions 342, 344 the fabrication process continues by appropriately masking the protection device structure 300, forming shallow N-type contact regions 346, 348, 350, 352 within the P-well regions 342, 344 and the interior N-well region 338, and forming shallow P-type contact regions 354, 356, 358 within the P-well regions 342, 344. The N-type regions 346, 352 function as a relatively higher doped emitter electrode for a respective bipolar junction transistor element (e.g., bipolar junction transistor elements 120, 122), P-type regions 354, 358 function as a relatively higher doped base electrode contact region for a respective bipolar junction transistor element, and N-type region 350 functions as a relatively higher doped collector electrode contact region for the bipolar junction transistor elements. In this regard, the N-type emitter region 352, the P-type base regions 344, 358 and the N-type collector regions 308, 316, 338 function as the first bipolar junction transistor element (e.g., bipolar transistor element 120) of the protection device structure 300 while the second N-type emitter region 346, the second P-type base regions 342, 354 and the N-type collector regions 308, 316, 338 function as the second bipolar junction transistor element (e.g., bipolar transistor element 122) of the protection device structure 300. As described in the context of FIG. 12, the N-type contact region 348 and P-type contact region 356 function as floating contact regions that are electrically connected to one another to reduce the current gain of the bipolar junction transistor element 122. As illustrated, the floating N-type contact region 348 resides laterally between the emitter contact region 346 and the collector well region 338 to collect a portion of electrons that would otherwise flow between the emitter contact region 346 and the collector well region 338 after protection device triggers while the P-type contact region 356 resides laterally between the floating N-type contact region 348 and the collector well region 338 and supplies holes that recombine with the electrons collected by floating N-type region 348 by virtue of the floating regions 348, 356 being short-circuited together.

In exemplary embodiments, prior to forming the shallow N-type and P-type contact regions, spaced apart silicide blocking regions 360 are formed overlying the P-well regions 342, 344. In this regard, the silicide blocking regions 360 prevent subsequent formation of silicide material on the portions of the P-well regions 342, 344 between neighboring shallow contact regions. The silicide blocking regions 360 include one or more silicide blocking materials, such as, one or more oxide materials and/or one or more nitride materials. For example, in one embodiment, the silicide blocking regions 360 are formed by forming a layer of oxide material (which may function as a gate dielectric for other devices on the wafer), forming a layer of nitride material overlying the oxide material, and etching the oxide and nitride materials to expose the portions of the P-well regions 342, 344 to be used for the shallow contact regions while the remaining silicide blocking material overlying the P-well regions 342, 344 remains intact. After forming the silicide blocking regions 360, the shallow N-type contact regions 346, 348, 350, 352 are formed by masking the protection device structure 300 with a masking material 347 that is patterned to expose interior portions of the P-well regions 342, 344 and the central portion of the interior N-well region 338 between shallow isolation regions 330, 332, as illustrated by FIG. 10. The shallow N-type regions 346, 348, 350, 352 are then formed by implanting N-type ions, such as phosphorous ions or arsenic ions, illustrated by arrows 349, in the exposed interior portions of regions 338, 342, 344 with a dopant concentration in the range of about $1 \times 10^{19}/cm^3$ to about $1 \times 10^{21}/cm^3$ and at an energy level in the range of about 20 keV to about 100 keV to provide the N-type regions 346, 348, 350, 352 with a depth (after diffusion) that is less than a depth of the shallow isolation regions 328, 330, 332, 334. For example, in accordance with one or more embodiments, the depth of the shallow N-type regions 346, 348, 350, 352 is in the range of about 0.05 microns to about 0.3 microns.

Referring to FIG. 11, in a similar manner, the shallow P-type contact regions 354, 356, 358, are formed by masking the protection device structure 300 with a masking material 355 that is patterned to expose corresponding portions of the P-well regions 342, 344. After the masking material 355 is patterned, the shallow P-type regions 354, 356, 358 are formed by implanting P-type ions, such as boron ions, illustrated by arrows 357, in the exposed portions of the P-well regions 342, 344 with a dopant concentration in the range of about $1 \times 10^{19}/cm^3$ to about $1 \times 10^{21}/cm^3$ and at an energy level in the range of about 2 keV to about 50 keV to provide the P-type regions 354, 356, 358 with a depth (after diffusion) that is less than a depth of the shallow isolation regions 328, 330, 332, 334 (e.g., in the range of about 0.05 microns to about 0.3 microns). Although FIG. 11 depicts the floating regions 348, 356 as being spaced apart, in some embodiments, the floating regions 348, 356 may abut or otherwise contact one another to conserve die area.

Turning now to FIG. 12, after forming the shallow N-type and P-type contact regions, fabrication of the protection device structure 300 may be completed by forming contacts 362 on the contact regions 346, 348, 350, 352, 354, 356, 358, providing electrical connections between the respective base electrode contact regions 354, 358 and emitter electrode contact regions 346, 352 of the respective bipolar junction transistor elements, and providing an electrical connection between the floating contact regions 348, 356. Thereafter, an electrical connection is provided between the base/emitter electrodes a respective bipolar junction transistor element and a corresponding physical interface 372, 374 of the electronic device that includes the protection device structure 300. The contacts 362 may be realized as a metal silicide layer formed by conformably depositing a layer of silicide-forming metal onto the exposed surfaces of the contact regions 346, 348, 350, 352, 354, 356, 358 and heating the protection device structure 300, for example by rapid thermal annealing (RTA), to react the silicide-forming metal with the exposed silicon and form the metal silicide layer 362 at the top of the contact regions 346, 348, 350, 352, 354, 356, 358 that are not masked by the silicide blocking regions 360.

After the contacts 362 are formed, the fabrication process continues by forming a layer of dielectric material 364 overlying the protection device structure 300, removing portions of the dielectric material 364 overlying contact regions 346, 348, 352, 354, 356, 358, and forming a conductive material 366 overlying the exposed contacts 362 for those contact regions 346, 348, 352, 354, 356, 358. The dielectric material 364 may be realized as an interlayer dielectric material, such as an oxide material, that is conformably deposited overlying the protection device structure 300 in a conventional manner. Portions of the dielectric material 364 overlying the contact regions 346, 348, 352, 354, 356, 358 are removed by etching the dielectric material 364 using an anisotropic etchant to provide voided regions overlying the contacts 362, and the conductive material 366 may be formed in the voided regions by conformably depositing a metal material overlying the protection device structure 300 to a thickness that is greater than or equal to the thickness of the dielectric material 364. As illustrated, the conductive material 366 may be patterned, routed, or otherwise formed to provide a direct electrical connection between the base and emitter electrode contact regions 352, 358 of BJT 120 and the base and emitter electrode contact regions 346, 354 of BJT 122, thereby effectively short-circuiting the base and emitter of a respective BJT 120, 122 together. Additionally, the conductive material 366 is patterned, routed, or otherwise formed to provide a first electrical interconnection between the electrode regions 352, 358 of BJT 120 and physical interface 372 of the electronic device and provide a second electrical interconnection between electrode regions 346, 354 of BJT 122 and physical interface 374 of the electronic device. The conductive material 366 is also patterned, routed, or otherwise formed to provide a direct electrical connection between the floating contact regions 348, 356 formed in the base well region 342 of BJT 122, thereby effectively short-circuiting the floating contact regions 348, 356 together. In exemplary embodiments, the dielectric material 364 overlying the collector contact 362 remains intact so that the collector regions 308, 316, 338, 350 are floating and not directly connected to any device terminals or any other external circuitry that could ground or otherwise influence the electrical potential of the common collector.

Figure 13:
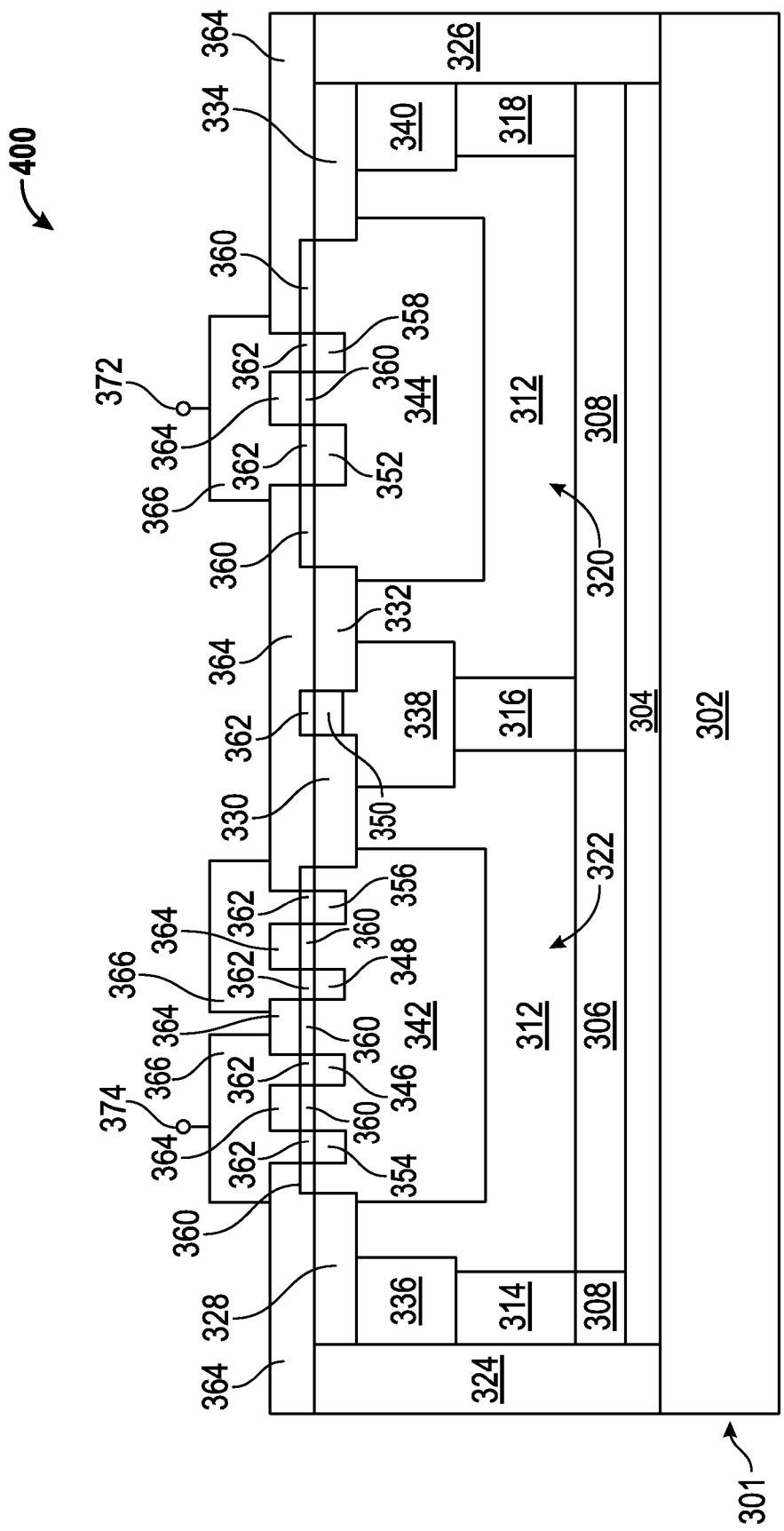
FIG. 13 illustrates, in cross section, an alternative embodiment of a protection device structure suitable for use with the electronic device of FIG. 1 in accordance with another embodiment of the invention.

Referring now to FIG. 13, in accordance with one or more alternative embodiments, to further increase the holding voltage, a protection device structure 400 suitable for use as the protection circuitry 108 in FIG. 1 may be formed without the buried region 308 underlying the base well region 342 of the transistor region 322 for the BJT 122. Referring again to FIG. 4 with reference to FIG. 15, to prevent the buried region 308 from extending underneath the base well region 342, the portion of the substrate 301 corresponding to transistor region 322 and/or base well region 342 may be masked with masking material 309 prior to implanting ions 310 so that the buried region 308 does not extend across the transistor region 322 underneath the subsequently formed epitaxial layer 312 and/or base well region 342 of the transistor region 322. In this regard, the buried region 308 underlies the base well region 344 and/or the transistor region 320 for BJT 120 and abuts the central sinker region 316 to provide an electrical connection between the buried region 308 and the central collector well region 338, while the semiconductor material of the seed layer 306 underlying the base well region 342 and/or transistor region 322 for BJT 122 remains intact overlying and abutting the buried layer 304. In this regard, the remaining portion of the seed layer 306 abuts the buried region 308 about the perimeter (or periphery) of the transistor region 322, or, in other words, the buried region 308 circumscribes or otherwise laterally encloses the remaining portion of the seed layer 306 underlying the base well region 342.

Figure 14:
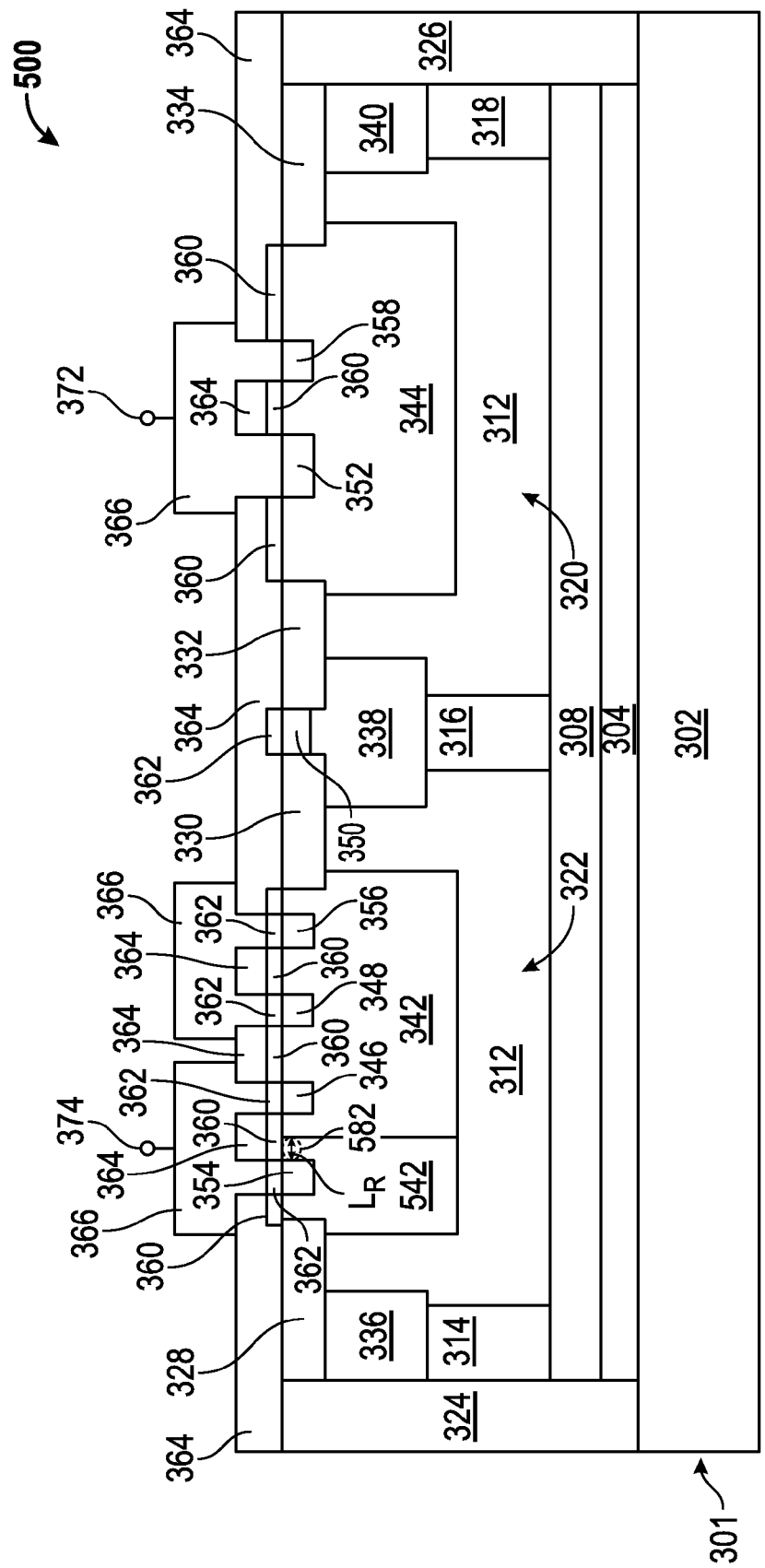
FIG. 14 illustrates, in cross section, another alternative embodiment of a protection device structure suitable for use with the electronic device of FIG. 1 in accordance with another embodiment of the invention.

Referring now to FIG. 14, in accordance with one or more alternative embodiments, to achieve a reduced the transient triggering voltage relative to the steady state (or DC) triggering voltage, a protection device structure 500 suitable for use as the protection circuitry 108 in FIG. 1 may be formed with a lighter doped (or higher resistivity) well region 542 that encompasses or otherwise surrounds the base electrode contact region 354. In this regard, the protection device structure 500 may be fabricated by masking the portion of the transistor region 322 corresponding to the higher resistivity base well region 542 with masking material 343 prior to implanting ions 345. To form the higher resistivity base well region 542, an implantation mask may be formed that exposes the portion of the epitaxial layer 312 of the transistor region 322 that resides between the base well region 342 and the shallow isolation region 328 and corresponds to the higher resistivity base well region 542 while masking the remainder of the protection device structure 500. Thereafter, the higher resistivity base well region 542 may be formed by implanting ions having the same conductivity as the base well region 342 but a lower dopant concentration than the base well region 342 into the exposed portion of the epitaxial layer 312 between the base well region 342 and the shallow isolation region 328. For example, a lighter doped P-well region 542 may be formed by implanting P-type ions, such as boron ions, in the exposed portion of the epitaxial layer 312 between the base well region 342 and the shallow isolation region 328 with a dopant concentration that is greater than the dopant concentration of the P-type epitaxial layer 312 but less than the dopant concentration of the first P-well region 342, preferably within the range of $1 \times 10^{15}/cm^3$ to about $1 \times 10^{18}/cm^3$, and more preferably about $1 \times 10^{16}/cm^3$ to about $5 \times 10^{17}/cm^3$, and at an energy level in the range of about 100 keV to about 1500 keV to provide the second P-well region 542 with a depth (after subsequent thermal annealing or any other diffusion) that is greater than a depth of the shallow isolation regions 328, 330, 332, 334 but less than the thickness of the epitaxial layer 312, so that at least a portion of the lighter doped P-type epitaxial layer 312 remains vertically between the second P-well region 542 and the N-type buried region 308.

As illustrated, the lighter doped P-well region 542 abuts the higher doped P-well region 342 and provides an electrical interconnection between the base electrode contact region 354 and the higher doped P-well region 342 via the intervening portion 582 of well region 542. In some embodiments, in lieu of implanting ions to form the lighter doped P-well region 542, the base electrode contact region 354 may be formed in the exposed portion epitaxial layer 312 between the isolation region 328 and the base well region 342, such that the intervening portion of the epitaxial layer 312 between the base electrode contact region 354 and the base well region 342 provides a relatively higher resistance electrical interconnection between the base electrode contact region 354 and the higher doped P-well region 342 via the intervening portion of the epitaxial layer 312.

Referring now to FIGS. 1 and 14, during an ESD event when a higher transient voltage is applied at terminal 102, 372 relative to terminal 104, 374, the base-collector junction of the first BJT 120 (e.g., between base regions 344, 358 and common collector regions 308, 316, 338) is forward-biased, thereby raising the electrical potential of the common collector region 308, 316, 338. The collector potential increases until the avalanche breakdown occurs across the collector-base junction of the second BJT 122. The carriers generated by the breakdown flow between the base electrode contact region 354 and the base well region 342 and/or emitter electrode contact region 346 through the increased intrinsic base resistance provided by the portion 582 of the lighter doped base well region 542 residing between the base electrode contact region 354 and the base well region 342 and/or emitter electrode contact region 346. As a result, by virtue of the base electrode contact region 354 being electrically connected to the emitter electrode contact region 346 (and thereby at the same electrical potential of the emitter electrode contact region 346), the base resistance provided by the intervening portion 582 of the higher resistivity base well region 542 increases the electrical potential (or voltage) of the higher conductivity base well region 342 relative to the emitter electrode contact region 346 to forward-bias the base-emitter junction. Accordingly, the added base resistance provided by the portion 582 of the higher resistivity base well region 542 lowers the transient triggering voltage ($V_{T1}$) of the BJT 122, and thereby lowers the transient triggering voltage ($V_{T1}$) of the protection circuitry 108 and/or protection device structure 300. Increasing the length of the intervening portion 582 of the higher resistivity base well region 542 ($L_R$) residing between the base electrode contact region 354 and the lateral boundary of the higher conductivity base well region 342 (or alternatively, increasing the distance between the base electrode contact region 354 and the lateral boundary of the higher conductivity base well region 342) further increases the base resistance, which, in turn, further reduces the transient triggering voltage ($V_{T1}$).

Referring to FIGS. 13-14, it should be noted that in some embodiments, to further increase the holding voltage, the protection device structure 500 can also formed without the buried region 308 underlying the base well regions 342, 542 of the transistor region 322 for the BJT 122, for example, by masking the portion of the substrate 301 corresponding to transistor region 322 and/or base well regions 342, 542 with masking material 309 prior to implanting ions 310. In this regard, the lighter doped base well region 542 may slightly decrease the holding voltage for a given distance between the base and emitter electrode contact regions 346, 354 because a lower level of impact ionization is required to maintain the "on" status after triggering with the increased base resistance. However, any decrease in holding voltage may be offset by removing the buried region 308 underlying the base well regions 342, 542 to provide the protection device structure 500 with a relatively high holding voltage and a relatively small difference between the transient triggering voltage ($V_{T1}$) and steady state breakdown voltage that accommodates narrower ESD design windows (e.g., functional circuitry 106 having a reduced difference between supply voltage ($V_O$) and breakdown voltage ($V_B$)).

For the sake of brevity, conventional techniques related to semiconductor and/or integrated circuit fabrication, ESD protection schemes, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context. The foregoing description also refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although a schematic shown in the figures may depict direct electrical connections between circuit elements and/or terminals, alternative embodiments may employ intervening circuit elements and/or components while functioning in a substantially similar manner.

In conclusion, systems, devices, and methods configured in accordance with example embodiments of the invention relate to:

An apparatus for a semiconductor device is provided. The semiconductor device comprises a first region of semiconductor material having a first conductivity type, a second region of semiconductor material within the first region, the second region having a second conductivity type opposite the first conductivity type, a third region of semiconductor material having the second conductivity type, a fourth region of semiconductor material, the fourth region having the first conductivity type, a fifth region of semiconductor material within the first region, the fifth region having the second conductivity type, and a sixth region of semiconductor material within the first region, the sixth region having the first conductivity type. A portion of the first region is disposed between the second region and the third region, the fifth region is disposed between the second region and the third region, the sixth region is disposed between the second region and the third region, the fourth region and the second region are electrically connected, and the fifth region and the sixth region are electrically connected. The first region comprises a base well region, the second region comprises an emitter region, the third region comprises a collector region, and the fourth region comprises a base contact region. In one or more exemplary embodiments, the first region is spaced apart from the third region, wherein at least a portion of a seventh region of semiconductor material having the first conductivity type and a dopant concentration that is less than a dopant concentration of the first region resides between the first region and the third region. In one or more embodiments, the fifth region is disposed between the second region and the sixth region and the sixth region is disposed between the fifth region and the third region. In a further embodiment, the second region is disposed between the fourth region and the fifth region. In another embodiment, the fifth region and the sixth region are floating. In one or more embodiments, the fifth region and the sixth region are abutting one another laterally. In yet another embodiment, the fifth region and the sixth region are short-circuited together and have the same electrical potential. In a further embodiment, the second region and the fourth region are short-circuited together. In one or more embodiments, the fourth region resides within the first region. In another embodiment, the first region has a first dopant concentration, the fifth region has a second dopant concentration that is greater than the first dopant concentration, and the sixth region has a third dopant concentration that is greater than the first dopant concentration. In another embodiment, the semiconductor device further comprises a seventh region of semiconductor material having the first conductivity type and a dopant concentration that is less than a dopant concentration of the first region, wherein the fourth region is electrically coupled to the first region via a portion of the seventh region disposed between the first region and the fourth region. In a further embodiment, the first region comprises a first base well region, the second region comprises an emitter region, the third region comprises a collector region, the fourth region comprises a base contact region, and the seventh region comprises a second base well region. In accordance with one or more embodiments, the semiconductor device further comprises a buried region of semiconductor material having the second conductivity type, wherein third region abuts the buried region, and a seventh region of semiconductor material underlying the first region, the seventh region having the first conductivity type, wherein the buried region abuts the seventh region. In other embodiments, the semiconductor device further comprises a substrate including a handle layer of semiconductor material and a buried layer of dielectric material overlying the handle layer, and a seventh region of semiconductor material underlying the first region, the seventh region having the first conductivity type, wherein the seventh region abuts the buried layer of dielectric material. In one embodiment, a device package comprises a plurality of protection circuits configured electrically in series between interfaces of the device package, wherein each protection circuit of the plurality comprises the semiconductor device.

In another embodiment, a protection device structure is provided that comprises a first base well region of semiconductor material having a first conductivity type, an emitter region of semiconductor material within the first base well region, the emitter region having a second conductivity type opposite the first conductivity type, a collector region of semiconductor material having the second conductivity type, wherein at least a portion of the first base well region is disposed between the emitter region and the collector region, a base contact region of semiconductor material having the first conductivity type, wherein at least a portion of the first base well region is disposed between the base contact region and the emitter region and the emitter region is disposed between the base contact region and the collector region, a first region of semiconductor material within the first base well region, the first region having the second conductivity type, and a second region of semiconductor material within the first base well region, the second region having the first conductivity type. The second region is disposed between the first region and the collector region, the first region is disposed between the emitter region and the collector region, the first region and the second region are electrically connected, and the base contact region and the emitter region are electrically connected. In exemplary embodiments, the first region and the second region are short-circuited together and the base contact region and the emitter region are short-circuited together. In accordance with one or more embodiments, the protection device structure further comprises a second base well region of semiconductor material having the first conductivity type, the collector region being disposed between the first base well region and the second base well region, a second emitter region of semiconductor material within the second base well region, the second emitter region having the second conductivity type, and a second base contact region of semiconductor material having the first conductivity type, wherein at least a portion of the second base well region is disposed between the second base contact region and the second emitter region, the emitter region is disposed between the second base contact region and the collector region, and the second base contact region and the second emitter region are electrically connected. In a further embodiment, the protection device structure further comprises a buried region of semiconductor material underlying the second base well region and abutting the collector region, the buried region having the second conductivity type, a third region of semiconductor material having the first conductivity type underlying the first base well region, the buried region abutting the third region, and a substrate including a handle layer of semiconductor material and a buried layer of dielectric material overlying the handle layer, wherein the third region overlies and abuts the buried layer of dielectric material. In one or more embodiments, a device including the protection device structure further comprises a first interface coupled to the second base contact region, a second interface coupled to the base contact region, and functional circuitry coupled to the first interface and the second interface, wherein the first region and the second region are short-circuited together, the base contact region and the emitter region are short-circuited together, and the second base contact region and the second emitter region are short-circuited together.

A method of fabricating a protection device structure on a semiconductor substrate is also provided. The method comprises forming a base well region of semiconductor material in the semiconductor substrate, the base well region having a first conductivity type, forming an emitter region of semiconductor material within the base well region, the emitter region having a second conductivity type opposite the first conductivity type, wherein at least a portion of the base well region is disposed between the emitter region and a collector region of semiconductor material having the second conductivity type, forming a base contact region of semiconductor material in the semiconductor substrate, the base well region having a first conductivity type, forming a first region of semiconductor material within the base well region between the emitter region and the collector region, the first region having the second conductivity type, forming a second region of semiconductor material within the base well region between the emitter region and the collector region, the second region having the first conductivity type, providing a first electrical connection between the base contact region and the emitter region, and providing a second electrical connection between the first region and the second region. In exemplary embodiments, providing the first electrical connection comprises short-circuiting the base contact region and the emitter region, and providing the second electrical connection comprises short-circuiting the first region and the second region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device comprising:
a first region of semiconductor material having a first conductivity type;
a second region of semiconductor material within the first region, the second region having a second conductivity type opposite the first conductivity type;
a third region of semiconductor material having the second conductivity type;
a fourth region of semiconductor material, the fourth region having the first conductivity type;
a fifth region of semiconductor material within the first region, the fifth region having the second conductivity type; and
a sixth region of semiconductor material within the first region, the sixth region having the first conductivity type, wherein:
a portion of the first region is disposed between the second region and the third region;
the fifth region is disposed between the second region and the third region;
the sixth region is disposed between the second region and the third region;
the fourth region and the second region are electrically connected;
the fifth region and the sixth region are electrically connected; and
the fifth region and the sixth region are floating.

2. The semiconductor device of claim 1, wherein:
the first region comprises a base well region;
the second region comprises an emitter region;
the third region comprises a collector region; and
the fourth region comprises a base contact region.

3. The semiconductor device of claim 1, wherein the first region is spaced apart from the third region.

4. The semiconductor device of claim 1, wherein:
the fifth region is disposed between the second region and the sixth region; and
the sixth region is disposed between the fifth region and the third region.

5. The semiconductor device of claim 4, wherein the second region is disposed between the fourth region and the fifth region.

6. The semiconductor device of claim 1, wherein the fifth region and the sixth region are abutting.

7. The semiconductor device of claim 1, wherein:
the second region and the fourth region are short-circuited together; and
the fifth region and the sixth region are short-circuited together.

8. The semiconductor device of claim 1, wherein the fourth region resides within the first region.

9. The semiconductor device of claim 1, further comprising:
a buried region of semiconductor material having the second conductivity type, wherein third region abuts the buried region; and
a seventh region of semiconductor material underlying the first region, the seventh region having the first conductivity type, wherein the buried region abuts the seventh region.

10. The semiconductor device of claim 1, further comprising:
a substrate including a handle layer of semiconductor material and a buried layer of dielectric material overlying the handle layer; and
a seventh region of semiconductor material underlying the first region, the seventh region having the first conductivity type, wherein the seventh region abuts the buried layer of dielectric material.

11. A semiconductor device comprising:
a first region of semiconductor material having a first conductivity type;
a second region of semiconductor material within the first region, the second region having a second conductivity type opposite the first conductivity type;
a third region of semiconductor material having the second conductivity type;
a fourth region of semiconductor material, the fourth region having the first conductivity type;
a fifth region of semiconductor material within the first region, the fifth region having the second conductivity type;
a sixth region of semiconductor material within the first region, the sixth region having the first conductivity type; and
a seventh region of semiconductor material having the first conductivity type and a dopant concentration that is less than a dopant concentration of the first region, wherein:
  a portion of the first region is disposed between the second region and the third region;
  the fifth region is disposed between the second region and the third region;
  the sixth region is disposed between the second region and the third region;
  the fourth region and the second region are electrically connected;
  the fifth region and the sixth region are electrically connected;
  the first region is spaced apart from the third region; and
  at least a portion of the seventh region resides between the first region and the third region.

12. A semiconductor device comprising:
a first region of semiconductor material having a first conductivity type;
a second region of semiconductor material within the first region, the second region having a second conductivity type opposite the first conductivity type;
a third region of semiconductor material having the second conductivity type;
a fourth region of semiconductor material, the fourth region having the first conductivity type;
a fifth region of semiconductor material within the first region, the fifth region having the second conductivity type;
a sixth region of semiconductor material within the first region, the sixth region having the first conductivity type; and
a seventh region of semiconductor material having the first conductivity type and a dopant concentration that is less than a dopant concentration of the first region, wherein:
  a portion of the first region is disposed between the second region and the third region;
  the fifth region is disposed between the second region and the third region;
  the sixth region is disposed between the second region and the third region;
  the fourth region and the second region are electrically connected;
  the fifth region and the sixth region are electrically connected; and
  the fourth region is electrically coupled to the first region via a portion of the seventh region disposed between the first region and the fourth region.

13. The semiconductor device of claim 12, wherein:
the first region comprises a first base well region;
the second region comprises an emitter region;
the third region comprises a collector region;
the fourth region comprises a base contact region; and
the seventh region comprises a second base well region.

14. A protection device structure comprising:
a first base well region of semiconductor material having a first conductivity type;
an emitter region of semiconductor material within the first base well region, the emitter region having a second conductivity type opposite the first conductivity type;
a collector region of semiconductor material having the second conductivity type, wherein at least a portion of the first base well region is disposed between the emitter region and the collector region;
a base contact region of semiconductor material having the first conductivity type, wherein at least a portion of the first base well region is disposed between the base contact region and the emitter region and the emitter region is disposed between the base contact region and the collector region;
a first region of semiconductor material within the first base well region, the first region having the second conductivity type;
a second region of semiconductor material within the first base well region, the second region having the first conductivity type;
a second base well region of semiconductor material having the first conductivity type, the collector region being disposed between the first base well region and the second base well region;
a second emitter region of semiconductor material within the second base well region, the second emitter region having the second conductivity type; and
a second base contact region of semiconductor material having the first conductivity type, wherein:
  the second region is disposed between the first region and the collector region;
  the first region is disposed between the emitter region and the collector region;
  the first region and the second region are electrically connected;
  the base contact region and the emitter region are electrically connected;
  at least a portion of the second base well region is disposed between the second base contact region and the second emitter region;
  the emitter region is disposed between the second base contact region and the collector region; and
  the second base contact region and the second emitter region are electrically connected.

15. The protection device structure of claim 14, wherein:
the first region and the second region are short-circuited; and
the base contact region and the emitter region are short-circuited.

16. A device including the protection device structure of claim 14, the device further comprising:
a first interface coupled to the second base contact region;
a second interface coupled to the base contact region; and
functional circuitry coupled to the first interface and the second interface, wherein:
  the first region and the second region are short-circuited;
  the base contact region and the emitter region are short-circuited; and
  the second base contact region and the second emitter region are short-circuited.

17. A semiconductor device comprising:
a base well region of semiconductor material having a first conductivity type;
an emitter region of semiconductor material within the base well region, the emitter region having a second conductivity type opposite the first conductivity type;
a collector region of semiconductor material having the second conductivity type;
a base contact region of semiconductor material, the base contact region having the first conductivity type;
a first floating region of semiconductor material within the base well region, the first floating region having the second conductivity type; and
a second floating region of semiconductor material within the base well region, the second floating region having the first conductivity type, wherein:
- a portion of the base well region is disposed between the emitter region and the collector region;
- the first floating region is disposed between the emitter region and the second floating region;
- the second floating region is disposed between the first floating region and the collector region;
- the base contact region and the emitter region are electrically connected; and
- the first floating region and the second floating region are electrically connected.

* * * * *